(12) United States Patent
De Vries et al.

(10) Patent No.: US 11,112,618 B2
(45) Date of Patent: Sep. 7, 2021

(54) BEAM SPLITTING APPARATUS

(71) Applicant: ASML Netherlands B.V., Veldhoven (NL)

(72) Inventors: Gosse Charles De Vries, Veldhoven (NL); Han-Kwang Nienhuys, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 302 days.

(21) Appl. No.: 15/754,480

(22) PCT Filed: Aug. 3, 2016

(86) PCT No.: PCT/EP2016/068513
§ 371 (c)(1),
(2) Date: Feb. 22, 2018

(87) PCT Pub. No.: WO2017/036717
PCT Pub. Date: Mar. 9, 2017

(65) Prior Publication Data
US 2018/0252930 A1 Sep. 6, 2018

(30) Foreign Application Priority Data
Sep. 3, 2015 (EP) .................................... 15183677

(51) Int. Cl.
*G02B 27/10* (2006.01)
*G03F 7/20* (2006.01)
(Continued)

(52) U.S. Cl.
CPC ....... *G02B 27/1093* (2013.01); *G02B 5/1838* (2013.01); *G02B 5/1857* (2013.01);
(Continued)

(58) Field of Classification Search
CPC ............. G03F 7/70191; G03F 7/70575; G03F 7/70158; G03F 7/70033; G03F 7/7055;
(Continued)

(56) References Cited

U.S. PATENT DOCUMENTS 4,168,107 A 9/1979 Sauter
4,241,999 A * 12/1980 Pouey .................... G01J 3/1838
356/331

(Continued)

FOREIGN PATENT DOCUMENTS

DE 198 51 749 A1 5/2000
DE 102013220448 A1 4/2015
(Continued)

OTHER PUBLICATIONS https://en.wikipedia.org/wiki/Diffraction_grating, retrieved Oct. 19, 2020 (Year: 2020).*

(Continued)

*Primary Examiner* — Christopher Stanford
(74) *Attorney, Agent, or Firm* — Sterne, Kessler, Goldstein & Fox P.L.L.C.

(57) ABSTRACT

A beam-splitting apparatus arranged to receive an input radiation beam and split the input radiation beam into a plurality of output radiation beams. The beam-splitting apparatus comprising a plurality of reflective diffraction gratings arranged to receive a radiation beam and configured to form a diffraction pattern comprising a plurality of diffraction orders, at least some of the reflective diffraction gratings being arranged to receive a $0^{th}$ diffraction order formed at another of the reflective diffraction gratings. The reflective diffraction gratings are arranged such that the optical path of each output radiation beam includes no more than one instance of a diffraction order which is not a $0^{th}$ diffraction order.

48 Claims, 9 Drawing Sheets

(51) Int. Cl.
*G02B 5/18* (2006.01)
*H01S 3/09* (2006.01)
*G02B 6/293* (2006.01)
*G02B 6/00* (2006.01)

(52) U.S. Cl.
CPC ............ *G02B 5/1861* (2013.01); *G02B 6/00* (2013.01); *G02B 6/29313* (2013.01); *G02B 6/29314* (2013.01); *G02B 27/1086* (2013.01); *G03F 7/70025* (2013.01); *G03F 7/70033* (2013.01); *G03F 7/7055* (2013.01); *G03F 7/70158* (2013.01); *G03F 7/70208* (2013.01); *G03F 7/70316* (2013.01); *G03F 7/70566* (2013.01); *G03F 7/70991* (2013.01); *H01S 3/0903* (2013.01)

(58) Field of Classification Search
CPC .. G02B 27/1086; G02B 5/1861; G02B 27/42; G02B 5/1814; G02B 5/1838
See application file for complete search history.

(56) References Cited

U.S. PATENT DOCUMENTS

| | | | | |
|---|---|---|---|---|
| 4,547,664 | A | | 10/1985 | Vogt et al. |
| 4,747,654 | A | | 5/1988 | Yi-Yan |
| 5,337,146 | A | * | 8/1994 | Azzam ............... G01J 3/189 250/225 |
| 5,756,961 | A | | 5/1998 | Sato et al. |
| 7,751,461 | B2 | * | 7/2010 | Hoose ............... H01S 3/08036 372/57 |
| 2005/0018189 | A1 | * | 1/2005 | Hampton ............ G01J 3/447 356/369 |
| 2005/0275818 | A1 | * | 12/2005 | Singer ............... G02B 19/0023 355/55 |
| 2010/0202057 | A1 | | 8/2010 | Neauport et al. |
| 2012/0300302 | A1 | | 11/2012 | Bonod et al. |
| 2014/0300968 | A1 | * | 10/2014 | Mirell ............... G02B 5/1866 359/572 |
| 2015/0034591 | A1 | | 2/2015 | Vink et al. |
| 2016/0252823 | A1 | | 9/2016 | Patra et al. |
| 2016/0357114 | A1 | | 12/2016 | Deguenther et al. |
| 2017/0357155 | A1 | * | 12/2017 | Quintanilha ......... G03F 7/2004 |

FOREIGN PATENT DOCUMENTS

| | | |
|---|---|---|
| DE | 102014203348 A1 | 8/2015 |
| EP | 1 014 116 A1 | 6/2000 |
| EP | 2 006 712 A2 | 12/2008 |
| JP | H 11-248913 A | 9/1999 |
| JP | 2016-537681 A | 12/2016 |
| WO | WO 2004/079410 A1 | 9/2004 |
| WO | WO 2014/108670 A1 | 7/2014 |
| WO | WO 2014/202585 A2 | 12/2014 |
| WO | WO 2015/044182 A2 | 2/2015 |
| WO | WO 2015/067467 A1 | 5/2015 |

OTHER PUBLICATIONS

Frassetto, Fabio, Paolo Villoresi, and Luca Poletto. "Beam separator for high-order harmonic radiation in the 3-10 nm spectral region." JOSA A 25.5 (2008): 1104-1114. (Year: 2008).*

Frassetto, F., et al. "Efficiency measurements on gratings in the off-plane mount for a high-resolution grazing-incidence XUV monochromator." Advances in X-Ray/EUV Optics and Components III. vol. 7077. International Society for Optics and Photonics, 2008. (Year: 2008).*

Poletto, Luca, et al. "Efficiency of gratings in the conical diffraction mounting for an EUV time-compensated monochromator." Fourth Generation X-Ray Sources and Optics II. vol. 5534. International Society for Optics and Photonics, 2004. (Year: 2004).*

Frassetto, Fabio, et al. "Single-grating monochromator for extreme-ultraviolet ultrashort pulses." Optics express 19.20 (2011): 19169-19181. (Year: 2011).*

International Search Report and Written Opinion issued in International Application No. PCT/EP2016/068513, dated Jul. 19, 2017; 23 pages.

International Preliminary Report on Patentability issued in International Application No. PCT/EP2016/068513, dated Mar. 6, 2018; 17 pages.

English-Language Abstract for German Patent Publication No. DE 198 51 749 A1, published May 11, 2000; 1 page.

Tan, Michael et al., "A High-Speed Optical Multi-drop Bus for Computer Interconnections," IEEE Computer Society, 16th IEEE Symposium on High Performance Interconnects, Aug. 2008; pp. 3-10.

Rutishauser, Simon, "X-ray grating interferometry for imaging and metrology," ETH Library, Mar. 10, 1985; 210 pages.

Braig, C. et al., "An EUV beamsplitter based on conical grazing incidence diffraction," Optical Society of America, Optics Express, vol. 20, No. 2, Jan. 16, 2012; pp. 1825-1838.

Savitskii, G.M. et al, "Efficiency optimization of reflecting diffraction gratings with a trapezoidal groove profile," Optical Society of America, Optical Spectroscopy (USSR), vol. 59, No. 2, Aug. 1985; pp. 251-254.

Wai Sze, Tiffany Lam et al., "Balancing polarization aberrat6ions in crossed fold mirrors," Optical Society of America, Applied Optics, vol. 54, No. 11, Apr. 10, 2015; pp. 3236-3245.

Thonn, T.F. et al., "Three-reflection halfwave and quarterwave retarders using dielectric-coated metallic mirrors," Electrical Engineering Faculty Publications, Applied Optics, vol. 23, Aug. 15, 1984; pp. 2752-2759.

Boots, Mark, "Designing and Optimizing Gratings for Soft X-ray Diffraction Efficiency," University of Saskatchewan, Sep. 2012; 240 pages.

Poletto, Luca et al., "Beam-splitting and recombining of the radiation from an EUV Free Electron Laser by means of reflection gratings," Fourth-Generation X-Ray Sources and Ultrafast X-ray Detectors, Proceedings of SPIE, vol. 5194, Jan. 28, 2004; pp. 95-104.

* cited by examiner

BEAM SPLITTING APPARATUS

CROSS-REFERENCE TO RELATED APPLICATIONS

This application claims priority of EP application 15183677.2 which was filed on Sep. 3, 2015 and which is incorporated herein in its entirety by reference.

FIELD

The present invention relates to a beam splitting apparatus. In particular, but not exclusively, the beam splitting apparatus may form part of a lithographic system comprising at least one lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus may be provided with EUV radiation from a beam delivery system having a beam splitting apparatus. It is an object of the present invention to obviate or mitigate at least one problem of prior art techniques.

SUMMARY

According to a first aspect of the invention there is provided a beam-splitting apparatus arranged to receive an input radiation beam and split the input radiation beam into a plurality of output radiation beams. The beam-splitting apparatus comprises a plurality of reflective diffraction gratings arranged to receive a radiation beam and configured to form a diffraction pattern comprising a plurality of diffraction orders, at least some of the reflective diffraction gratings being arranged to receive a $0^{th}$ diffraction order formed at another of the reflective diffraction gratings. The reflective diffraction gratings are arranged such that the optical path of each output radiation beam includes no more than one instance of a diffraction order which is not a $0^{th}$ diffraction order.

The power and/or the pointing direction of a $0^{th}$ diffraction order which is formed at a diffraction grating is typically more stable with variations in the wavelength and/or the pointing direction of radiation which is incident on the diffraction grating, when compared to higher diffraction orders. Providing a beam-splitting apparatus in which the optical path of each output radiation beam includes no more than one instance of a diffraction order which is not a $0^{th}$ diffraction order (e.g. a +1 or −1 diffraction order) therefore advantageously improves the stability of the power and/or the pointing direction of the output radiation beams with changes in the wavelength and/or the pointing direction of the input radiation beam. Such an arrangement may be particularly advantageous in embodiments in which the input radiation beam is provided from a radiation source comprising a free electron laser, since the output of a free electron laser may undergo variations in wavelength and/or pointing direction with time.

The output radiation beams may be for supplying to a plurality of lithographic apparatus.

The diffraction gratings may be configured such that the output radiation beams each have substantially the same power.

The beam-splitting apparatus may comprise a first reflective diffraction grating arranged to receive the input radiation beam and configured to form a diffraction pattern comprising a plurality of diffraction orders, each diffraction order forming a sub-beam, the sub-beams including at least a first sub-beam and a second sub-beam, wherein the second sub-beam forms a first output radiation beam and a second reflective diffraction grating arranged to receive the first sub-beam formed at the first diffraction grating and configured to form a diffraction pattern comprising a plurality of diffraction orders, each diffraction order forming a sub-beam, the sub-beams including at least a third sub-beam and a fourth sub-beam, wherein the fourth sub-beam forms a second output radiation beam.

The first and second diffraction gratings may be configured such that the first output radiation beam and the second output radiation beam have substantially the same power.

The first sub-beam may be a zeroth diffraction order.

The third sub-beam may be a zeroth diffraction order.

The first diffraction grating may be configured such that the power of the first sub-beam is greater than the power of the second sub-beam.

The first diffraction grating may be configured such that the power of the first sub-beam is 50% or more of the power of the radiation beam received by the first diffraction grating. The first diffraction grating may be configured such that the power of the first sub-beam is 70% or 80% or more of the power of the radiation beam received by the first diffraction grating.

The second diffraction grating may be configured such that the power of the third sub-beam is greater than the power of the fourth sub-beam.

The second diffraction grating may be configured such that the power of the third sub-beam is 50% or more of the power of the first sub-beam received by the second diffraction grating. The second diffraction grating may be configured such that the power of the third sub-beam is 70% or 80% or more of the power of the first sub-beam received by the second diffraction grating.

The first diffraction grating may be further configured to form a fifth sub-beam in addition to the first and second sub-beams, and wherein the fifth sub-beam forms a third output radiation beam.

The first diffraction grating may be configured such that the power of the third output radiation beam is substantially the same as the power of the first output radiation beam.

The second diffraction grating may be further configured to form a sixth sub-beam in addition to the third and fourth sub-beams, and wherein the sixth sub-beam forms a fourth output radiation beam.

The second diffraction grating may be configured such that the power of the fourth output radiation beam is substantially the same as the power of the second output radiation beam.

The beam-splitting apparatus may further comprise a third diffraction grating arranged to receive the third sub-beam formed at the second diffraction grating and configured to form a diffraction pattern comprising a plurality of diffraction orders, each diffraction order forming a sub-beam, the sub-beams including at least a seventh sub-beam and an eighth sub-beam, wherein the eighth sub-beam forms a fifth output radiation beam.

The first, second and third diffraction gratings may be configured such that the first output radiation beam, the second output radiation beam and the fifth output radiation beam have substantially the same power.

The third diffraction grating may form a diffraction pattern further comprising a ninth sub-beam. The ninth sub-beam may form a further output radiation beam.

Each sub-beam which is not incident on a diffraction grating may form an output radiation beam.

Each output radiation beam may have substantially the same power.

At least one of the first and second diffraction gratings may comprise a reflective surface comprising a plurality of grooves formed in the reflective surface, wherein each groove has a substantially flat bottom portion extending between inclined portions and wherein each groove is separated by a substantially flat ridge extending between adjacent grooves.

The diffraction grating may comprise a reflective coating disposed on a substrate in which the grooves are formed.

The substrate may comprise a silicon substrate.

The reflective coating may comprise at least one or ruthenium and molybdenum.

A width of the flat bottom portions of the first diffraction grating may be different to a width of the flat bottom portions of the second diffraction grating.

The width of the flat bottom portions of the first diffraction grating may be greater than the width of the flat bottom portions of the second diffraction grating.

A pitch of the first diffraction grating may be substantially the same as a pitch of the second diffraction grating.

The beam-splitting apparatus may further comprise one or more actuators operable to alter the orientation of one or more of the diffraction gratings, so as to alter a grazing incidence angle and/or an azimuthal angle with which radiation is incident on the one or more diffraction gratings.

Altering the grazing incidence angle and/or the azimuthal angle may change the amount of radiation which is diffracted into different diffraction orders at the diffraction grating. This may be used, for example, to control the power of diffraction orders formed at the diffraction grating.

According to a second aspect of the invention there is provide a beam delivery system comprising a beam-splitting apparatus according to the first aspect and directing optics arranged and configured to direct the output radiation beams to respective lithographic apparatuses.

According to a third aspect of the invention there is provided a beam delivery system comprising one or more optical elements arranged to receive a polarized input radiation beam and split the polarized input radiation beam into at least a first output radiation beam and a second output radiation beam and first directing optics comprising a plurality of reflective elements arranged to direct the first output radiation beam to a first lithographic apparatus and second directing optics comprising a plurality of reflective elements arranged to direct the second output radiation beam to a second lithographic apparatus, wherein the directing optics are arranged such that a change in polarization introduced, by the first directing optics, in the first output radiation beam along the optical path of the first output radiation beam to the first lithographic apparatus is substantially the same as a change in polarization introduced, by the second directing optics, in the second output radiation beam along the optical path of the second output radiation beam to the second lithographic apparatus.

It may be desirable to provide a plurality of output radiation beams each having a desired polarization state. By providing directing optics which each cause substantially the same polarization change in a radiation beam, the polarization state of radiation which is input to the directing optics may advantageously be selected such that the output radiation beams each have the desired polarization state.

The first directing optics may be arranged such that a first retardance is introduced into the first output radiation beam along the optical path of the first output radiation beam to the first lithographic apparatus and the second directing optics may be arranged such that a second retardance is introduced into the second output radiation beam along the optical path of the second output radiation beam to the second lithographic apparatus, wherein the second retardance is substantially the same as the second retardance.

The orientation of the first directing optics may be a mirror image of the orientation of the second directing optics.

The plurality of reflective elements of the first directing optics may comprise a first reflective element arranged to receive and reflect the first output radiation beam, thereby defining a plane of incidence in which the radiation incident on and reflected from the first reflective element lies and one or more further reflective elements arranged to successively receive and reflect the first output radiation beam thereby defining a plane of incidence at each reflective element, wherein the one or more further reflective elements are orientated such that the plane of incidence at each of the one or more further reflective elements lies either substantially parallel to or substantially perpendicular to the plane of incidence at the reflective element from which the first output radiation beam was last reflected.

The plurality of reflective elements of the first directing optics may further comprise a plurality of reflective elements who together are configured to cause substantially no net change in the polarization state of the first output radiation beam.

The plurality of reflective elements of the second directing optics may comprises a second reflective element arranged to receive and reflect the second output radiation beam, thereby defining a plane of incidence in which the radiation incident on and reflected from the second reflective element lies, and one or more further reflective elements arranged to successively receive and reflect the second output radiation beam thereby defining a plane of incidence at each reflective element, wherein the one or more further reflective elements are orientated such that the plane of incidence at each of the one or more further reflective elements lies either substantially parallel to or substantially perpendicular to the plane of incidence at the reflective element from which the second output radiation beam was last reflected.

The plurality of reflective elements of the second directing optics may further comprise a plurality of reflective elements who together are configured to cause substantially no net change in the polarization state of the first output radiation beam.

The one or more optical elements may comprise a diffraction grating arranged to receive the polarized input radiation beam and may be configured to form a diffraction pattern comprising a plurality of diffraction orders, one of the diffraction orders forming the first output radiation beam and another of the diffraction orders forming the second output radiation beam.

The diffraction grating may comprise a reflective surface comprising a plurality of grooves formed in the reflective surface, wherein each groove has a substantially flat bottom portion extending between inclined portions and wherein each groove is separated by a substantially flat ridge extending between adjacent grooves.

The diffraction grating may comprise a reflective coating disposed on a substrate in which the grooves are formed.

The substrate may comprise a silicon substrate.

The reflective coating may comprise at least one of ruthenium and molybdenum.

The one or more optical elements may comprise a first reflective element arranged to receive a first portion of the input radiation beam and reflect the first portion so as to form the first output radiation beam and a second reflective element arranged to receive a second portion of the input radiation beam and reflect the second portion so as to form the second output radiation beam.

The one or more optical elements may be further configured to split the input radiation beam into a first sub-beam in addition to the first and second output radiation beams and the beam-splitting apparatus may further comprise one or more further optical elements arranged to receive the first sub-beam and split the sub-beam into at least a third output radiation beam and a fourth output radiation beam and third directing optics comprising a plurality of reflective elements arranged to direct the third output radiation beam to a third lithographic apparatus and fourth directing optics comprising a plurality of reflective elements arranged to direct the fourth output radiation beam to a fourth lithographic apparatus, wherein the directing optics are arranged and configured such that a retardance introduced, by the directing optics, in the third output radiation beam during the optical path of the third output radiation beam to the third lithographic apparatus is substantially the same as a retardance introduced, by the directing optics, in the fourth output radiation beam during the optical path of the fourth output radiation beam to the fourth lithographic apparatus.

The third and/or the fourth directing optics may have one or more features of the first and/or the second directing optics described above.

The directing optics may be arranged and configured such that polarization states of the first output radiation beam, the second output radiation beam, the third output radiation beam and the fourth output radiation beam which are output from the first, second, third and fourth directing optics are substantially the same.

One of the diffraction orders formed at the diffraction grating may form the first sub-beam.

The beam delivery system may further comprise one or more reflective elements arranged in the optical path of a sub-beam which is provided to a diffraction grating, wherein the one or more reflective elements are configured to introduce a retardance in the sub-beam which is substantially equal and opposite to a retardance which is introduced at one or more diffraction gratings, such that the polarization state of the sub-beam which is reflected from the one or more reflective elements is substantially the same as the polarization state of the input radiation beam which is incident on the one or more optical elements.

The one or more reflective elements may be arranged such that a plane of incidence at the one or more reflective elements is substantially perpendicular to a plane of incidence at the one or more diffraction gratings.

A sum of grazing incidence angles at which the first sub-beam is incident on each of the one or more reflective elements may be substantially equal to a sum of grazing incidence angles at which the input radiation beam is incident on the one or more diffraction gratings.

The first and second reflective elements may be arranged such that a portion of the input radiation beam is not incident on the first or second reflective elements and continues to be incident on the one or more further optical elements.

According to a fourth aspect of the invention there is provided a lithographic system comprising a beam delivery system according to the first or third aspect, a first lithographic apparatus arranged to receive a first output radiation beam output from the beam delivery system and a second lithographic apparatus arranged to receive a second output radiation beam from the beam delivery system.

The lithographic system may further comprise a radiation source configured to provide the input radiation beam.

The radiation source may comprise a free electron laser.

According to a fifth aspect of the invention there is provided a method of manufacturing a diffraction grating, the method comprising depositing a mask on to a substrate, wherein the mask comprises a plurality of parallel ridges, etching the regions of the substrate in between the regions on which the ridges are deposited so as to form grooves in between the ridges, stopping the etching at a point at which the grooves comprise a substantially flat bottom portion extending between inclined portions, removing the mask from the substrate to expose substantially flat ridges in the substrate which extend between adjacent grooves.

The method may further comprise etching the substrate after the mask has been removed from the substrate.

Etching the substrate non-selectively after the mask has been removed may serve to round corners formed in the substrate (for example, the corners of ridges in the substrate). This may advantageously improve adhesion of a reflective coating on the substrate and decrease the likelihood of defects forming in the reflective coating.

The method may further comprise depositing a reflective coating on the substrate.

The substrate may comprise silicon.

The etching may be performed along (111) and (−111) crystal planes of the silicon.

The etching may comprise wet chemical etching.

The wet chemical etching may be performed using at least one of potassium hydroxide, tetramethylammonium hydroxide and an aqueous solution of ethylene diamine and pyrocatechol.

According to a sixth aspect of the invention there is provided a method of manufacturing a diffraction grating, the method comprising: depositing a mask on to a substrate, wherein the mask comprises a plurality of parallel ridges; etching regions of the substrate in between the regions on which the ridges are deposited so as to form grooves in between the ridges;

removing the mask from the substrate to expose ridges in the substrate which extend between adjacent grooves; and etching the substrate after the mask has been removed so as to substantially round edges of the ridges.

Etching the substrate non-selectively after the mask has been removed may serve to round edges formed in the substrate. This may advantageously improve adhesion of a reflective coating on the substrate and decrease the likelihood of defects forming in the reflective coating.

The method may further comprise depositing a reflective coating on the substrate.

According to an eighth aspect of the invention there is provided a diffraction grating comprising: a substrate including a plurality of grooves formed in the substrate and a plurality of ridges disposed between adjacent grooves, wherein edges of the ridges have substantially rounded corners; and a reflective coating disposed on the substrate.

Rounded edges of the ridges may improve adhesion of a reflective coating on the substrate and may decrease the likelihood of defects forming in the reflective coating.

Each groove may have a substantially flat bottom portion extending between inclined portions.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which.

DETAILED DESCRIPTION

Figure 1:
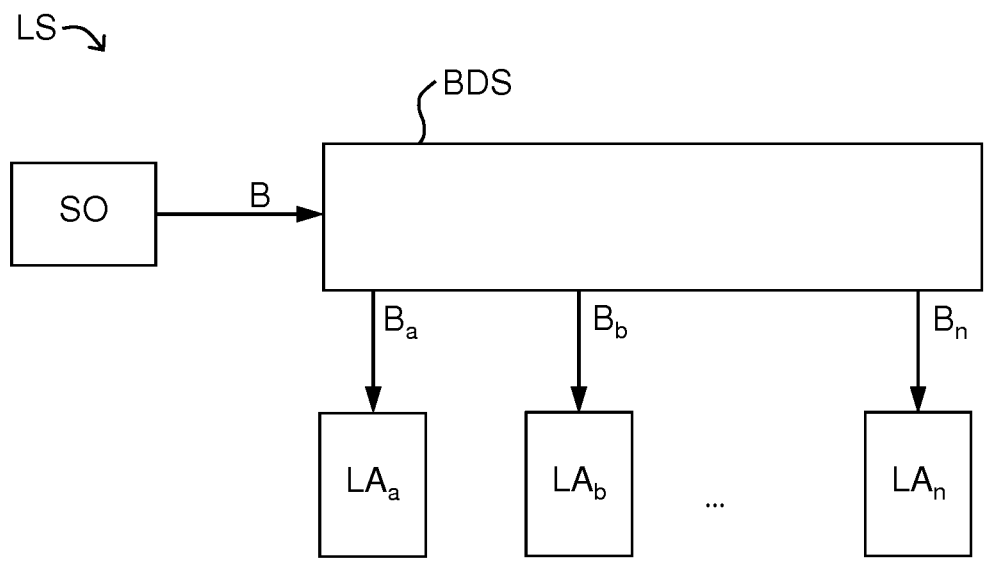
FIG. 1 is a schematic illustration of a lithographic system.

FIG. 1 shows a lithographic system LS according to one embodiment of the invention. The lithographic system LS comprises a radiation source SO, a beam delivery system BDS and a plurality of lithographic apparatuses $LA_a$-$LA_n$ (e.g. ten lithographic apparatuses). The radiation source SO is configured to generate an extreme ultraviolet (EUV) radiation beam B (which may be referred to as a main beam). The radiation source SO and the beam delivery system BDS may together be considered to form a radiation system, the radiation system being configured to provide radiation to one or more lithographic apparatuses $LA_a$-$LA_n$.

The beam delivery system BDS comprises beam splitting optics and may optionally also comprise beam expanding optics and/or beam shaping optics. The main radiation beam B is split into a plurality of radiation beams $B_a$-$B_n$ (which may be referred to as branch beams), each of which is directed to a different one of the lithographic apparatuses $LA_a$-$LA_n$, by the beam delivery system BDS.

In an embodiment, the branch radiation beams $B_a$-$B_n$ are each directed through a respective attenuator (not shown in FIG. 1). Each attenuator may be arranged to adjust the intensity of a respective branch radiation beam $B_a$-$B_n$ before the branch radiation beam $B_a$-$B_n$ passes into its corresponding lithographic apparatus $LA_a$-$LA_n$.

The radiation source SO, beam delivery system BDS and lithographic apparatus $LA_a$-$LA_n$ may all be constructed and arranged such that they can be isolated from the external environment. A vacuum may be provided in at least part of the radiation source SO, beam delivery system BDS and lithographic apparatuses $LA_a$-$LA_n$ so as to reduce the absorption of EUV radiation. Different parts of the lithographic system LS may be provided with vacuums at different pressures (i.e. held at different pressures which are below atmospheric pressure).

Figure 2:
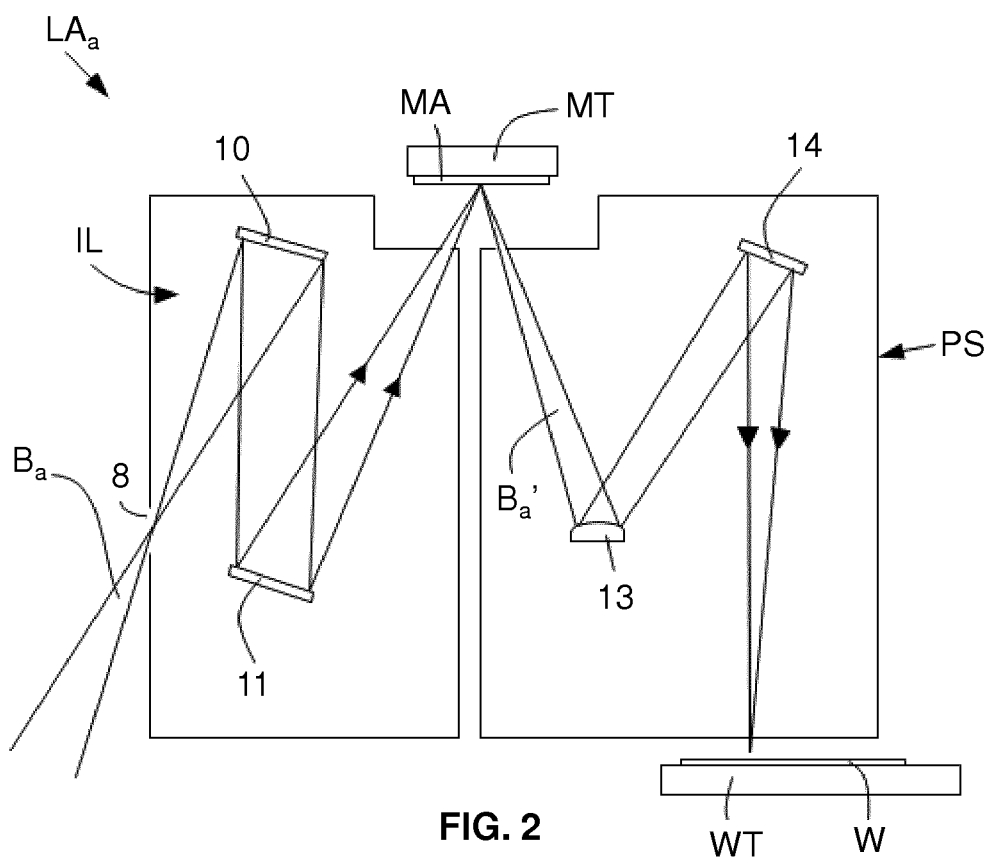
FIG. 2 is a schematic illustration of a lithographic apparatus that forms part of the lithographic system of FIG. 1.

Referring to FIG. 2, a lithographic apparatus $LA_a$ comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus $LA_a$ before it is incident upon the patterning device MA. The projection system PS is configured to project the radiation beam $B_a'$ (now patterned by the patterning device MA) onto the substrate W. The substrate W may include previously formed patterns. Where this is the case, the lithographic apparatus aligns the patterned radiation beam $B_a'$ with a pattern previously formed on the substrate W.

The branch radiation beam $B_a$ that is received by the lithographic apparatus $LA_a$ passes into the illumination system IL from the beam delivery system BDS though an opening 8 in an enclosing structure of the illumination system IL. Optionally, the branch radiation beam $B_a$ may be focused to form an intermediate focus at or near to the opening 8.

The illumination system IL may include a field facet mirror 10 and a pupil facet mirror 11. The field facet mirror 10 and pupil facet mirror 11 together provide the radiation beam $B_a$ with a desired cross-sectional shape and a desired angular distribution. The radiation beam $B_a$ passes from the illumination system IL and is incident upon the patterning device MA held by the support structure MT. The patterning device MA reflects and patterns the radiation beam to form a patterned beam $B_a'$. The illumination system IL may include other mirrors or devices in addition to or instead of the field facet mirror 10 and pupil facet mirror 11. The illumination system IL may, for example, include an array of independently moveable mirrors. The independently moveable mirrors may, for example, measure less than 1 mm across. The independently moveable mirrors may, for example, be microelectromechanical systems (MEMS) devices.

Following redirection (e.g. reflection) from the patterning device MA the patterned radiation beam $B_a'$ enters the projection system PS. The projection system PS comprises a plurality of mirrors 13, 14 which are configured to project the radiation beam $B_a'$ onto a substrate W held by the substrate table WT. The projection system PS may apply a reduction factor to the radiation beam, forming an image with features that are smaller than corresponding features on the patterning device MA. A reduction factor of 4 may, for example, be applied. Although the projection system PS has two mirrors in FIG. 2, the projection system may include any number of mirrors (e.g. six mirrors).

The lithographic apparatus $LA_a$ is operable to impart a radiation beam $B_a$ with a pattern in its cross-section and project the patterned radiation beam onto a target portion of a substrate thereby exposing a target portion of the substrate to the patterned radiation. The lithographic apparatus $LA_a$ may, for example, be used in a scan mode, wherein the support structure MT and the substrate table WT are scanned synchronously while a pattern imparted to the radiation beam $B_a'$ is projected onto a substrate W (i.e. a dynamic exposure). The velocity and direction of the substrate table WT relative to the support structure MT may be determined by the demagnification and image reversal characteristics of the projection system PS.

Referring again to FIG. 1, the radiation source SO is configured to generate an EUV radiation beam B with sufficient power to supply each of the lithographic apparatuses $LA_a$-$LA_n$. As noted above, the radiation source SO may comprise a free electron laser.

Figure 3:
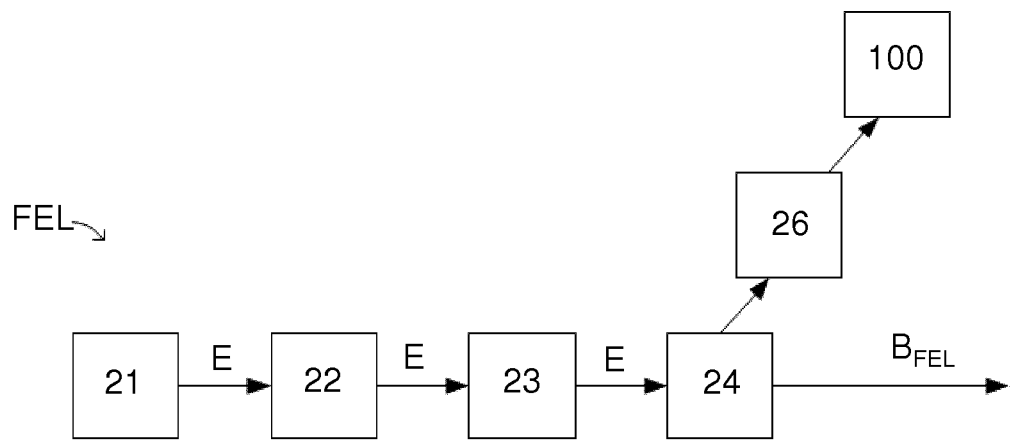
FIG. 3 is a schematic illustration of a free electron laser that forms part of the lithographic system of FIG. 1.

FIG. 3 is a schematic depiction of a free electron laser FEL comprising an injector 21, a linear accelerator 22, a bunch compressor 23, an undulator 24, an electron decelerator 26 and a beam dump 100.

The injector 21 is arranged to produce a bunched electron beam E and comprises an electron source (for example a thermionic cathode or a photo-cathode) and an accelerating electric field. Electrons in the electron beam E are further accelerated by the linear accelerator 22. In an example, the linear accelerator 22 may comprise a plurality of radio frequency cavities, which are axially spaced along a common axis, and one or more radio frequency power sources, which are operable to control electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the cavities may be conventionally conducting (i.e. not superconducting), and may be formed from, for example, copper. Other types of linear accelerators may be used such as, for example, laser wakefield accelerators or inverse free electron laser accelerators.

Optionally, the electron beam E passes through a bunch compressor 23, disposed between the linear accelerator 22 and the undulator 24. The bunch compressor 23 is configured to spatially compress existing bunches of electrons in the electron beam E. One type of bunch compressor 23 comprises a radiation field directed transverse to the electron beam E. An electron in the electron beam E interacts with the radiation and bunches with other electrons nearby. Another type of bunch compressor 23 comprises a magnetic chicane, wherein the length of a path followed by an electron as it passes through the chicane is dependent upon its energy. This type of bunch compressor may be used to compress bunches of electrons which have been accelerated in a linear accelerator 22 by a plurality of resonant cavities.

The electron beam E then passes through the undulator 24. Generally, the undulator 24 comprises a plurality of modules (not shown). Each module comprises a periodic magnet structure, which is operable to produce a periodic magnetic field and is arranged so as to guide the relativistic electron beam E produced by the injector 21 and linear accelerator 22 along a periodic path within that module. The periodic magnetic field produced by each undulator module causes the electrons to follow an oscillating path about a central axis. As a result, within each undulator module, the electrons radiate electromagnetic radiation generally in the direction of the central axis of that undulator module.

The path followed by the electrons may be sinusoidal and planar, with the electrons periodically traversing the central axis. Alternatively, the path may be helical, with the electrons rotating about the central axis. The type of oscillating path may affect the polarization of radiation emitted by the free electron laser. For example, a free electron laser which causes the electrons to propagate along a helical path may emit elliptically polarized radiation.

As electrons move through each undulator module, they interact with the electric field of the radiation, exchanging energy with the radiation. In general the amount of energy exchanged between the electrons and the radiation will oscillate rapidly unless conditions are close to a resonance condition. Under resonance conditions, the interaction between the electrons and the radiation causes the electrons to bunch together into microbunches, modulated at the wavelength of radiation within the undulator, and coherent emission of radiation along the central axis is stimulated. The resonance condition may be given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period for the undulator module that the electrons are propagating through, $\gamma$ is the Lorentz factor of the electrons and K is the undulator parameter. A is dependent upon the geometry of the undulator 24: for a helical undulator that produces circularly polarized radiation A=1, for a planar undulator A=2, and for a helical undulator which produces elliptically polarized radiation (that is neither circularly polarized nor linearly polarized) 1<A<2. In practice, each bunch of electrons will have a spread of energies although this spread may be minimized as far as possible (by producing an electron beam E with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 24. The free electron laser FEL may operate as a recirculating amplifier free electron laser (RAFEL), wherein a portion of the radiation generated by the free electron laser FEL is used to seed further generation of radiation.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator 24 in order to keep bunches of electrons at or close to resonance as they are guided though the undulator 24. The tapering may be achieved by varying the amplitude of the periodic magnetic field and/or the undulator period $\lambda_u$ within each undulator module and/or from module to module. Additionally or alternatively tapering may be achieved by varying the helicity of the undulator 24 (by varying the parameter A) within each undulator module and/or from module to module.

Radiation produced within the undulator 24 is output as a radiation beam $B_{FEL}$.

After leaving the undulator 24, the electron beam E is absorbed by a dump 100. The dump 100 may comprise a sufficient quantity of material to absorb the electron beam E. The material may have a threshold energy for induction of radioactivity. Electrons entering the dump 100 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It may be desirable to reduce the energy of electrons in the electron beam E before they enter the dump 100. This removes, or at least reduces, the need to remove and dispose of radioactive waste from the dump 100. This is advantageous since the removal of radioactive waste requires the free electron laser FEL to be shut down periodically and the disposal of radioactive waste can be costly and can have serious environmental implications.

The energy of electrons in the electron beam E may be reduced before they enter the dump 100 by directing the electron beam E through a decelerator 26 disposed between the undulator 24 and the beam dump 100.

In an embodiment the electron beam E which exits the undulator 24 may be decelerated by passing the electrons back through the linear accelerator 22 with a phase difference of 180 degrees relative to the electron beam produced by the injector 21. The RF fields in the linear accelerator therefore serve to decelerate the electrons which are output from the undulator 24 and to accelerate electrons output from the injector 21. As the electrons decelerate in the linear accelerator 22 some of their energy is transferred to the RF fields in the linear accelerator 22. Energy from the decelerating electrons is therefore recovered by the linear accelerator 22 and may be used to accelerate the electron beam E output from the injector 21. Such an arrangement is known as an energy recovery linear accelerator (ERL).

In some embodiments of a lithographic system LS the radiation source SO may comprise a single free electron laser FEL. In such embodiments the main beam B which is emitted from the radiation source SO may be a laser beam $B_{FEL}$ which is emitted from the free electron laser FEL. In other embodiments, a lithographic system LS may comprise a plurality of free electron lasers. A plurality of laser beams $B_{FEL}$ emitted from the free electron lasers may be combined to form a single main beam B comprising radiation emitted from the plurality of free electron lasers FEL.

Figure 4A:
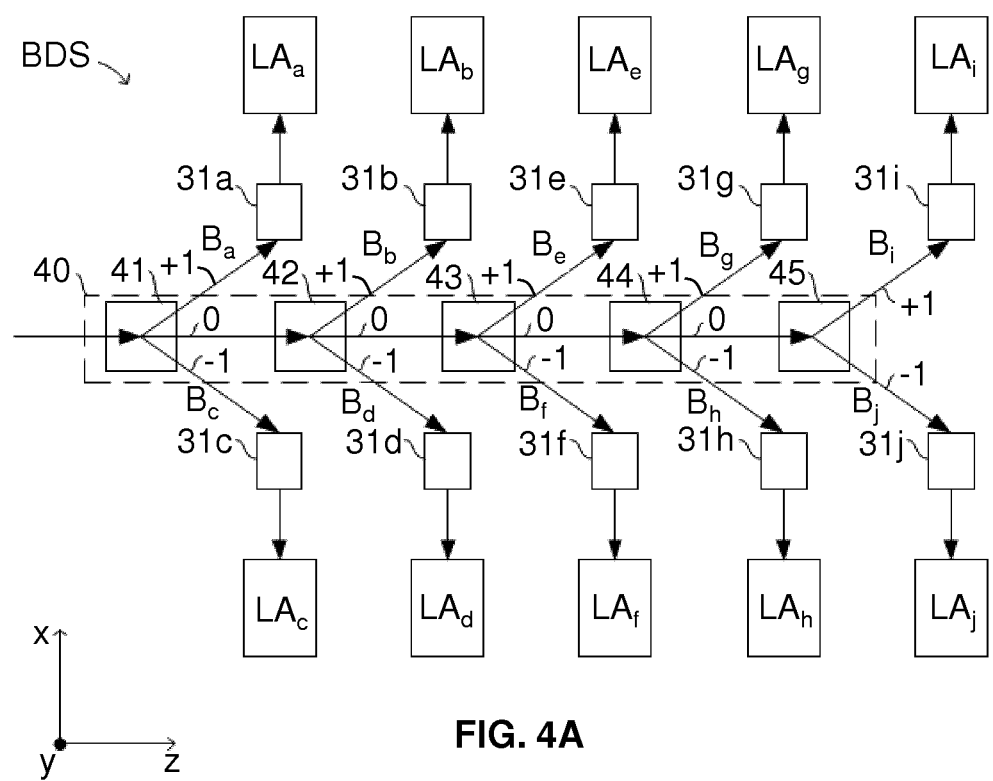
FIGS. 4A and 4B are schematic illustrations of a beam delivery system according to an embodiment of the invention.
Figure 4B:
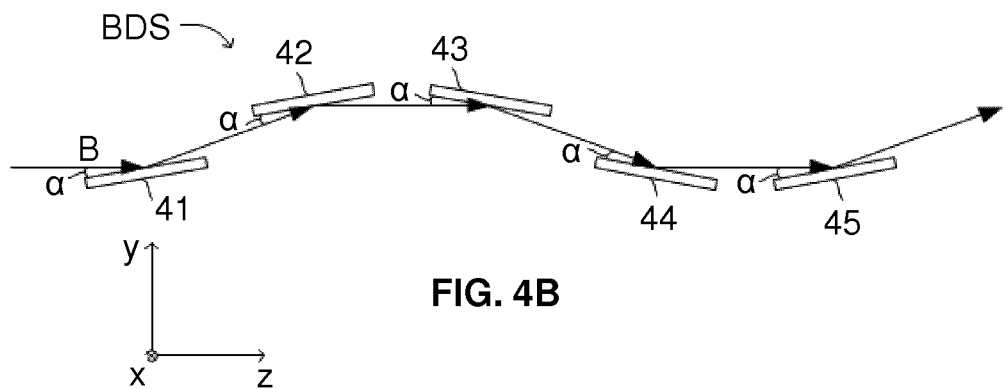

FIGS. 4A and 4B are schematic illustrations of a portion of a beam delivery system BDS according to an embodiment of the invention. FIG. 4A shows a top-down view of the beam delivery system BDS and a FIG. 4B shows a side-on view of the beam delivery system BDS. Cartesian co-ordinates are used consistently in FIGS. 4A and 4B.

The beam delivery system BDS includes a beam-splitting apparatus 40 which is arranged to receive an input radiation beam B and split the input radiation beam B into a plurality of output radiation beams $B_a$-$B_j$ for supplying to a plurality of lithographic apparatuses $LA_a$-$LA_j$. The beam delivery system BDS further comprises directing optics 31a-31j arranged to direct the output radiation beams $B_a$-$B_j$ to the lithographic apparatuses $LA_a$-$LA_j$. The output radiation beams $B_a$-$B_j$ may be referred to as branch radiation beams.

The beam-splitting apparatus 40 comprises a plurality of reflective diffraction gratings 41-45. The diffraction gratings 41-45 may be conical diffraction gratings. Each of the diffraction gratings 41-45 is arranged to receive a radiation beam and form a diffraction pattern comprising a plurality of diffraction orders. Each of the diffraction orders forms a sub-beam. The input radiation beam B is initially incident on a first diffraction grating 41. The first diffraction grating is configured to form a diffraction pattern comprising a +1 diffraction order, a $0^{th}$ diffraction order and a −1 diffraction order. The $0^{th}$ diffraction which is formed at the first diffraction grating 41 is incident on the second diffraction grating 42. The second diffraction grating 42 is arranged to receive the $0^{th}$ diffraction order and form a diffraction pattern comprising a +1 diffraction order, a $0^{th}$ diffraction order and a −1 diffraction order.

The +1 diffraction order which is formed at the first diffraction grating 41 forms a first branch radiation beam $B_a$ which is output from the beam-splitting apparatus 40. The +1 diffraction order which is formed at the second diffraction grating 42 forms a second branch radiation beam $B_b$ which is output from the beam-splitting apparatus 40. The −1 diffraction order which is formed at the first diffraction grating 41 forms a third branch radiation beam $B_c$ which is output from the beam-splitting apparatus 40. The −1 diffraction order which is formed at the second diffraction grating 42 forms a fourth branch radiation beam $B_d$ which is output from the beam-splitting apparatus 40.

The $0^{th}$ diffraction order which is formed at the second diffraction grating is incident on a third diffraction grating 43 which in turn forms a +1 diffraction order, a $0^{th}$ diffraction order and a −1 diffraction order. The +1 and −1 diffraction orders formed at the third diffraction grating 43 form fifth $B_e$ and sixth $B_f$ branch radiation beams respectively. The $0^{th}$ diffraction order formed at the third diffraction grating is incident on a fourth diffraction grating 44 which in turn forms a +1 diffraction order, a $0^{th}$ diffraction order and a −1 diffraction order. The +1 and −1 diffraction orders formed at the fourth diffraction grating 44 form seventh $B_g$ and eighth $B_t$ branch radiation beams respectively. The $0^{th}$ diffraction order formed at the fourth diffraction grating 44 is incident on a fifth diffraction grating 45 which in turn forms a +1 diffraction order and a −1 diffraction order. The +1 and −1 diffraction orders formed at the fifth diffraction grating 45 form ninth and tenth branch radiation beams $B_i$ and $B_j$ respectively.

The first to tenth branch radiation beams $B_a$-$B_j$ are each directed to respective lithographic apparatuses $LA_a$-$LA_j$ by directing optics 31a-31j. In the arrangement which is shown in FIG. 4A, each of the lithographic apparatuses receives a branch radiation beam $B_a$-$B_j$ which corresponds to a +1 or a −1 diffraction order formed at a diffraction grating. Each diffraction grating 41-45 receives a radiation beam which is either received directly from the radiation source SO (in the case of the first diffraction grating 41) or corresponds with a $0^{th}$ diffraction order formed at a previous diffraction grating (in the case of the second 42, third 43, fourth 44 and fifth 45 diffraction gratings). That is, all +1 and −1 diffraction orders form branch radiation beams $B_a$-$B_j$ which are output to lithographic apparatuses and do not form an input radiation beam to a subsequent diffraction grating. The optical path of each branch radiation beam $B_a$-$B_j$ from the radiation source SO to a lithographic apparatus $LA_a$-$LA_j$ therefore only includes one instance of a +1 or a −1 diffraction order. As will be described in further detail below, this advantageously causes the power of each branch radiation beam $B_a$-$B_j$ to be relatively stable with any changes in the wavelength and/or the pointing direction of the input radiation beam B (when compared to a prior art beam delivery system).

In other embodiments more or fewer than ten branch radiation beams may be formed by a beam-splitting apparatus. In some embodiments more or fewer than three diffraction orders may be formed at a single diffraction grating. For example, in addition to the +1, −1 and $0^{th}$ diffraction orders described above, at some diffraction gratings +2 and/or −2 diffraction orders may also be formed. In general any number of diffraction gratings may be used in order to form any number of branch radiation beams. At each diffraction grating any number of diffraction orders may be formed. At least some of the diffraction gratings are arranged to receive a $0^{th}$ diffraction order formed at another of the diffraction gratings. As was described above with reference to FIG. 4A, the diffraction gratings may be arranged such that the optical path of a branch radiation beam includes no more than one instance of a diffraction order which is not a $0^{th}$ diffraction order (e.g. a +1 or −1 diffraction order).

Returning to the embodiment shown in FIGS. 4A and 4B, as can be seen from FIG. 4B, radiation is incident on each diffraction grating at a grazing incidence angle α. The grazing incidence angle α may be chosen in order to limit the amount of radiation which is absorbed at the diffraction grating. In general, for EUV radiation incident on a reflective surface at grazing incidence angles, the amount of absorption increases with increases in the grazing incidence angle. Relatively small grazing incidence angles α may therefore be chosen in order to limit absorption at the diffraction gratings 41-45. The grazing incidence angle α may be less than 5°, for example, around 2° or even less, for example around 1°. In the arrangement which is shown in FIG. 4B the diffraction gratings 41-45 are arranged to alternately direct the radiation in the positive and negative y-directions. This may allow the diffraction gratings 41-45 to be arranged at a similar position in the y-direction and may allow for convenient arrangement of the components of the beam delivery system BDS.

In the embodiment which is shown in FIG. 4B the grazing incidence angle α at each diffraction grating is approximately the same. However, in some embodiments the grazing incidence angle α may be different at different diffraction gratings.

In some embodiments it is desirable to provide the lithographic apparatuses $LA_a$-$LA_j$ with branch radiation beams $B_a$-$B_j$ having approximately the same power. The power of the branch radiation beams $B_a$-$B_j$ which are provided to the lithographic apparatuses $LA_a$-$LA_j$ depends on the power of the input radiation beam B and on the fraction of the power of the radiation beam incident on each diffraction grating which is split into each of the diffraction orders. The fraction of the power of a radiation beam incident on a diffraction grating which is split into different diffraction orders may be referred to as the split ratio of the diffraction grating. For example, a diffraction grating which splits 20% of incident radiation into a +1 diffraction order, 60% of incident radiation into a $0^{th}$ diffraction order and 20% of incident radiation into a −1 diffraction order may be described as having a split ratio of 20:60:20 or equivalently 1:3:1.

The power of the radiation which is incident on each of the diffraction gratings decreases from the first diffraction grating 41 to the fifth diffraction grating 45. That is, the power of the input radiation beam B which is incident on the first diffraction grating 41 is greater than the power of the radiation beam which is incident on the second diffraction grating 42, which in turn is greater than the power of the radiation beam which is incident on the third diffraction grating 43. The power of the radiation beam which is incident on the third diffraction grating 43 is greater than the power of the radiation beam which is incident on the fourth diffraction grating 24. The power of the radiation beam which is incident on the fourth diffraction 24 grating is greater than the power of the radiation beam which is incident on the fifth diffraction grating 45.

In order for the branch radiation beams $B_a$-$B_j$, which are supplied to the lithographic apparatuses $LA_a$-$LA_j$ to have substantially the same power, the split ratios of the diffraction gratings are different from each other. In particular, the fraction of incident radiation which is directed into the +1 and −1 diffraction orders increases sequentially from the first diffraction grating 41 to the fifth diffraction grating 45. The power of incident radiation which is directed into the $0^{th}$ diffraction orders decreases sequentially from the first diffraction grating 41 to the fifth diffraction grating 45.

Table 1 lists the fraction of incident power which is split into each diffraction order at each diffraction grating according to one embodiment. The first column of table 1 lists the diffraction grating to which the corresponding row relates. The second column of table 1 indicates the fraction of power which is incident on each diffraction grating which is split into each of the +1 and −1 diffraction orders. For example, the first diffraction grating 41 splits one tenth of the power of the input radiation beam B into the +1 diffraction order and one tenth of the power of the input radiation beam B into the −1 diffraction order. The second column of table 1 indicates the fraction of power which is incident on each diffraction grating which forms the $0^{th}$ diffraction order. For example, the first diffraction grating splits eight tenths of the power of the input radiation beam B into the $0^{th}$ diffraction order. The fourth column of table 1 indicates the fraction of the power of the input radiation beam B which is directed into branch radiation beams formed at each diffraction grating. For example, the first diffraction grating 41 forms branch radiation beams $B_a$, $B_c$ which each have powers corresponding to one tenth of the power of the input radiation beam B.

TABLE 1

Fraction of incident power which is split into each diffraction order at each diffraction grating.

| Diffraction Grating | Fraction of incident power in each of +1 and −1 diffraction orders | Fraction of incident power in $0^{th}$ diffraction order | Fraction of total power directed to lithographic apparatuses |
|---|---|---|---|
| First  | 1/10 | 8/10 | 1/10 |
| Second | 1/8  | 6/8  | 1/10 |
| Third  | 1/6  | 4/6  | 1/10 |
| Fourth | 1/4  | 2/4  | 1/10 |
| Fifth  | 1/2  | 0    | 1/10 |

It can be seen from table 1 that the split ratios of the diffraction gratings are configured such that each of the +1 and −1 diffraction orders formed at the diffraction gratings 41-45 have powers which are approximately equal to one tenth of the power of the input radiation beam B. That is, the power of the input radiation beam B is split equally into ten branch radiation beams $B_a$-$B_j$ each having approximately the same power.

In the example which is summarized in table 1 it is assumed that no radiation is lost at the diffraction gratings and that each diffraction grating splits all of the radiation incident on it into +1, $0^{th}$ and −1 diffraction orders (as is the case for the first, second, third and fourth diffraction gratings 41, 42, 43, 24) or into +1 and −1 diffraction orders (as is the case for the fifth diffraction grating 45). In practice each diffraction grating will absorb some of the radiation which is incident on it. A diffraction grating may also diffract some radiation into higher diffraction orders which are not used to form branch radiation beams. Some radiation will therefore be lost at each diffraction grating (e.g. by absorption and/or to higher diffraction orders). The split ratios of each diffraction grating may be adjusted from those indicated in table 1 in order to account for radiation loss. For example, the fraction of incident radiation which forms the $0^{th}$ order at the first diffraction grating 41 may be increased in order to account for radiation loss at the subsequent diffraction gratings 42-45. Similarly the split ratios at the second to fourth diffraction gratings 42-24 may be adjusted in order to account for radiation loss. In general, the split ratios of each diffraction grating may be set such that the power of each branch radiation beam $B_a$-$B_j$ is approximately equal.

The split ratios of each diffraction grating may depend on the number of further diffraction gratings and lithographic apparatuses which are supplied with radiation from the diffraction orders formed at the diffraction grating. In general, the fraction of the power of the input radiation beam B which forms the $0^{th}$ diffraction order at the first diffraction grating may be greater than 50%. In some embodiments the fraction of the power of the input radiation beam B which forms the $0^{th}$ diffraction order at the first diffraction grating may be greater than 60%, greater than 70% or greater than 80%.

Figure 5A:
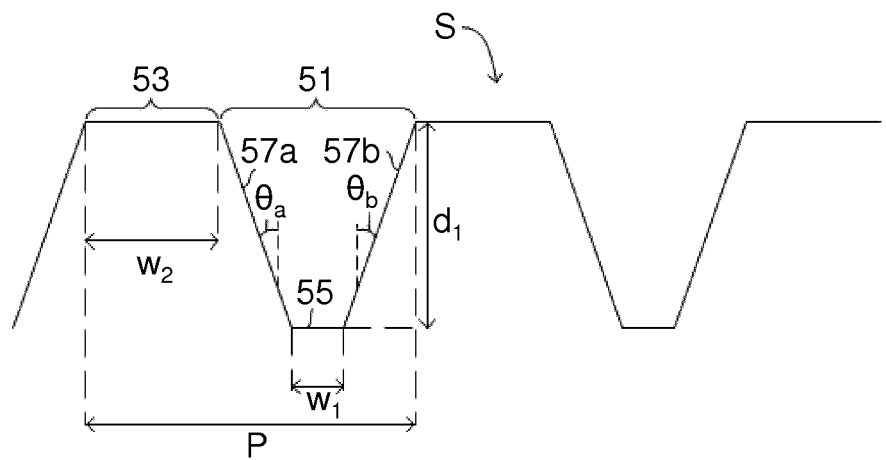
FIG. 5A is a schematic illustration of a portion of a diffraction grating.

FIG. 5A is a schematic illustration of a portion of a diffraction grating which may form any of the first to fifth diffraction gratings 41-45. The diffraction grating comprises a reflective surface S which includes a plurality of grooves 51. The grooves are separated by substantially flat ridges 53 which extend between adjacent grooves. The grooves 51 and the ridges 53 together form a periodic structure having a pitch P. Each groove 51 includes a substantially flat bottom portion 55 which extends between inclined portions 57a and 57b. The flat bottom portions 55 of the grooves 51 have a width $w_1$. The ridges 53 which extend between adjacent grooves 51 have a width $w_2$. The grooves 51 have a depth $d_1$. A region of the diffraction grating structure having a length equal to the pitch P (e.g. a region of the grating including one ridge 53 and one groove 51) may be referred to as a unit cell of the grating structure. As will be described in further detail below, the shape of a unit cell of the grating structure may determine the split ratio of the diffraction grating.

The diffraction grating may be formed by forming the grooves 51 in a substrate. For example, the diffraction grating may comprise a silicon substrate. The grooves 51 may be formed by any suitable process such as, for example, etching, stamping or electroforming. In some embodiments the grooves 51 may be etched into the substrate using a wet chemical etching. For example, an etchant such as potassium hydroxide (KOH), tetramethylammonium hydroxide (TMAH) and/or an aqueous solution of ethylene diamine and pyrocatechol (EDP) may be used. In embodiments in which the substrate has a crystalline structure (e.g. the substrate is a silicon substrate), the grooves may be formed by etching along crystal planes of the substrate. For example, in some embodiments, the flat ridges 53 may be formed along a (100) crystallographic plane. The inclined portions 57a, 57b of the grooves 51 may be formed along (111) and (−111) crystallographic planes. The inclined portions 57a, 57b form angles $\theta_a$ and $\theta_b$ respectively with a vertical direction, where the vertical direction is perpendicular to the plane in which the ridges 53 lie. In an embodiment in which the substrate is a silicon substrate, the ridges 53 are formed along a (100) crystallographic plane, and the inclined portions 57a, 57b are formed along (111) and (−111) crystallographic planes, the angles $\theta_a$ and $\theta_b$ may both be approximately 35°. In other embodiments, various different layouts are possible depending on the (h k l) numbers describing the ridges 53.

The flat bottom portions 55 of the grooves 51 may be formed by truncating a process used to form the grooves 51. For example, an etching process may be stopped before the inclined portions 57a, 57b meet each other, thereby leaving a flat bottom portion 55 which extends between the inclined portions 57a, 57b.

The ridges 53 may be formed in the substrate by depositing an etch resistant mask on the substrate prior to etching the grooves 51. For example, an etch resistant mask comprising a plurality of parallel ridges may be deposited onto the substrate. An etch process may then be performed which, due to the presence of the etch resistant mask, only etches regions of the substrate in between the etch resistant mask. The etch process forms the grooves 51 whilst leaving the ridges 53 which extend between the grooves 51. The etch resistant mask may subsequently be removed from the substrate so as to expose the substantially flat ridges 53.

The parallel ridges of the etch resistant mask may be formed using a photo-lithographic process. For example a photoresist may initially be deposited onto all regions of the substrate. Portions of the photoresist may then be exposed to radiation as part of a lithographic exposure, thereby triggering a change of state of the exposed portions. The resist may then be developed either by removing the exposed portions of the resist or removing the non-exposed portions of the resist (depending on whether a positive or negative resist is used). The remaining portions of the resist may form the etch resistant mask comprising a plurality of parallel ridges. A lithographic exposure may, for example, be performed by stepping or scanning a patterning device relative to the substrate. The patterning device may impart a radiation beam with a pattern which may scanned or stepped across the substrate.

The diffraction grating may be provided with a coating of a more reflective (less absorbing) material (for EUV radiation). For example, the diffraction grating may be provided with a coating of ruthenium (Ru) or molybdenum (Mo). This may, for example, have a thickness of around 50 nm. Where a reflective coating is provided, a further coating may be applied to the reflective coating. For example, oxides, nitrides, carbides, etc, may be applied in order to increase the stability and resistance of the reflective coating to conditions likely to be present.

The use of a substrate comprising silicon has been described above. A substrate comprising silicon may be relatively cheap and may have advantageous thermo-mechanical properties when compared with substrates formed from other materials. For example, the thermal conductivity divided by the coefficient of expansion of silicon may advantageously be higher than for other suitable materials. However, in some embodiments other materials may be used. Examples of other materials which may be anisotropically etched to provide a grating include germanium (Ge), gallium arsenide (GaAs), silicon-germanium (SiGe), indium phosphide (InP) and indium arsenide (InAs). Generally, however, any suitable (crystalline) material may be used.

In general, a diffraction grating having a structure similar to the structure which is shown in FIG. 5A may be manufactured using any suitable procedure (whether described herein or otherwise). A diffraction grating having the structure which is shown in FIG. 5A may be characterised by three variable parameters; the pitch P, the width $w_1$ of the flat bottom portion 55 of the groove 51 and the width $w_2$ of the ridges 53. In some embodiments, the angles $\theta_a$ $\theta_b$ which the inclined portions 57a, 57b form with the vertical may be considered as a variable parameter. However, as was described above the angles $\theta_a$ $\theta_b$ may be determined by the orientation of crystallographic planes of the material from which the substrate is formed. The orientation of crystallographic planes in the substrate may be an inherent property of the material of the substrate and may not therefore be a freely variable parameter. In embodiments in which the angles $\theta_a$ $\theta_b$ are considered to be fixed, the depth $d_1$ of the grooves 51 is uniquely determined by the pitch P, the width $w_1$ of the flat bottom portion 55 of the groove 51 and the width $w_2$ of the ridges 53.

The pitch P, the width $w_1$ of the flat bottom portion 55 of the groove 51 and the width $w_2$ of the ridges 53 may be selected in order to form a diffraction grating having desired optical properties. For a radiation beam of a given wavelength which is incident on a diffraction grating at a given grazing incidence angle and a given angle relative to the orientation of the grooves 51 (i.e. an azimuthal angle φ between a plane of incidence and the grooves 51), the direction of the diffraction orders formed at the diffraction grating is dependent on the pitch P of the grating and is independent of the shape of the unit cells of the grating. The amount of power which is split into each diffraction order (i.e. the split ratio) is dependent on the shape of the unit cells of the grating. For a diffraction grating having the structure depicted in FIG. 5A, the shape of the unit cell is uniquely determined by the width $w_1$ of the flat bottom portion 24 and the width $w_2$ of the ridges 53. The split ratio of a diffraction grating may therefore be varied by varying the width $w_1$ and/or the width $w_2$.

The fraction of incident power which is diffracted into a $0^{th}$ diffraction order may be increased by increasing the fraction of a unit cell which is made up of a ridge 53 or a flat bottom portion 55. For example, the width w, and/or the width $w_2$ may be increased in order to increase the fraction of incident power which is diffracted into a $0^{th}$ diffraction order. However, the fraction of incident power which is split into each diffraction order may be a complicated function of the parameters of the grating. Increasing the width $w_1$ and/or the width $w_2$ may not therefore always increase the fraction of incident power which is diffracted into the $0^{th}$ diffraction order.

As was described above with reference to FIG. 4A the fraction of incident power which is diffracted into a $0^{th}$ diffraction order decreases sequentially from the first diffraction grating 41 to the fifth diffraction grating 45 in which substantially no power is diffracted into the $0^{th}$ diffraction order. In some embodiments the width $w_1$ of the flat bottom portions 55 of the diffraction gratings may decrease sequentially from the first diffraction grating 41 to the fifth diffraction grating 45. That is, the width $w_1$ of the flat bottom portions 55 of the first diffraction grating 41 is greater than the width $w_1$ of the flat bottom portions 55 of the second diffraction grating 42, which in turn is greater than the width $w_1$ of the flat bottom portions 55 of the third diffraction grating 43. The width $w_1$ of the flat bottom portions 55 of the third diffraction grating 43 is greater than the width $w_1$ of the fourth diffraction grating 24, which in turn is greater than the width $w_2$ of the fifth diffraction grating 45.

In some embodiments, the width $w_2$ of the ridges of the diffraction gratings may decrease sequentially from the first diffraction grating 41 to the fifth diffraction grating 45. In some embodiments, both the width $w_1$ of the flat bottom portions 55 and the width $w_2$ of the ridges 53 decrease sequentially from the first diffraction grating 41 to the fifth diffraction grating 45. In other embodiments only one of the width $w_1$ and the width $w_2$ decreases sequentially from the first diffraction grating 41 to the fifth diffraction grating 45.

However, as was described, above the fraction of incident power which is split into each diffraction order is typically a complicated function of the parameters of the grating. In some embodiments the width w, and/or the width $w_2$ may not decrease sequentially from the first diffraction grating 41 to the fifth diffraction grating 45. The fraction of the incident radiation which is split into a $0^{th}$ diffraction order may however, still decrease sequentially from the first diffraction grating 41 to the fifth diffraction grating 45. In general any grating configuration may be used which provides the desired fractions of incident radiation in each diffraction order.

It can be seen from FIG. 4A that the fifth diffraction grating 45 is configured such that substantially no $0^{th}$ diffraction order is formed at the fifth diffraction grating 45. Instead approximately 50% of the radiation incident on the fifth diffraction grating is split into a +1 diffraction order and approximately 50% of the radiation incident on the fifth diffraction grating is split into a −1 diffraction order. This may be achieved, for example, by providing a diffraction grating having a groove depth $d_1$ which is approximately equal to the wavelength λ of the incident radiation divided by four times the grazing incidence angle α in radians (i.e. $d_1 = \lambda/(4\alpha)$). Specular reflection from the flat bottom portion 55 and the ridges 53 will have a phase difference between them which depends on the groove depth $d_1$. In an arrangement in which the groove depth is given by $d_1=\lambda/(4\alpha)$ then the specular reflection from the flat bottom portions 55 will interfere destructively with the specular reflection from the ridges 53, thereby leading to suppression of radiation in the $0^{th}$ diffraction order. The $0^{th}$ diffraction order may be substantially completely suppressed if, for example, the width $w_1$ is approximately equal to the width $w_2$ such that the specular reflections from the ridges 53 and the flat bottom portions 55 have approximately the same power (and thus cancel each other out when destructively interfering with each other).

In an embodiment, the fifth diffraction grating 45 may, for example, be configured to receive radiation having a wavelength of approximately 13.5 nm. The radiation may be incident on the diffraction grating 45 at a grazing incidence angle of approximately 17.5 milliradians. The depth $d_1$ of the groove 51 may be approximately 192 nm. The pitch P of the grating may be approximately 1090 nm. The width $w_1$ of the flat bottom portions 55 may be approximately 411 nm and the width $w_2$ of the ridges 53 may also be approximately 411 nm. In such an embodiment the $0^{th}$ diffraction order may be substantially suppressed such that substantially all of the radiation which is incident on the diffraction grating is split into a +1 and a −1 diffraction order.

In the embodiments which have been described above it has been assumed that the fraction of incident radiation which is split into the +1 diffraction order is substantially the same as the fraction of incident radiation which is split into the −1 diffraction order. In embodiments in which the grooves 51 in a diffraction grating are aligned parallel to or perpendicular to the direction of propagation of the incident radiation, the power of the diffraction pattern formed by the diffraction grating will be generally symmetrical. That is, the power of the +1 diffraction order is approximately equal to the power of the −1 diffraction order. Reference to the grooves 51 being substantially parallel to the direction of propagation of incident radiation is intended to mean that an azimuthal angle φ between a plane of incidence (in which the incident radiation beam lies) and the grooves 51 is approximately equal to zero. The grooves being substantially perpendicular to the direction of propagation of incident radiation is intended to mean that the azimuthal angle φ is approximately equal to 90°.

In the arrangement which is shown in FIG. 4A it may be advantageous for the power of the +1 diffraction order to be approximately equal to the power of the −1 diffraction order since both diffraction orders form branch radiation beams which are supplied to lithographic apparatuses. The first to fifth diffraction gratings 41-45 may therefore be orientated such that the grooves 51 are substantially parallel or perpendicular to the direction of propagation of the radiation beam incident on each diffraction grating.

It may be preferred for the grooves 51 to be substantially parallel to the incident radiation (i.e. φ is approximately 0°) as opposed to the grooves 51 being substantially perpendicular to the incident radiation (i.e. φ is approximately 90°). Arranging the grooves 51 such that they are substantially parallel to the incident radiation (i.e. φ is approximately 90°) may advantageously allow a grating to be designed which forms a limited number of diffraction orders (e.g. 2, 3 or 5 diffraction order as opposed to tens of diffraction orders). Reference to the grooves 51 being substantially parallel with the incident radiation may be interpreted to mean that the magnitude of the azimuthal angle φ is less than the grazing incidence angle α with which the radiation is incident on the diffraction grating.

Figure 6:
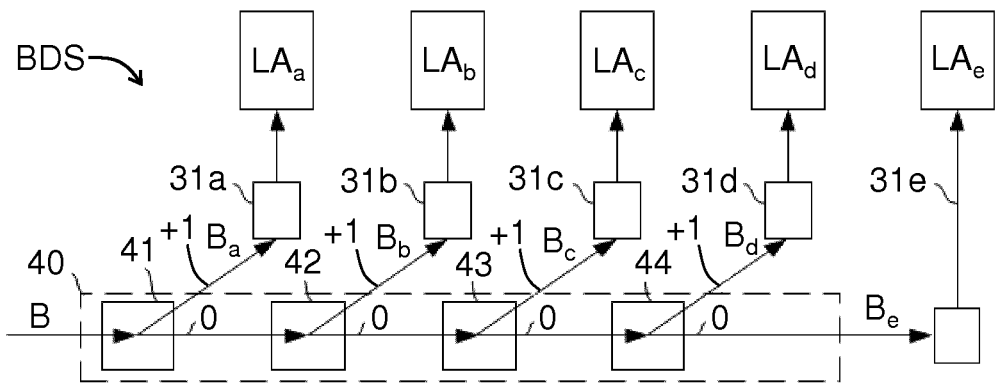
FIG. 6 is a schematic illustration of a beam delivery system according to an alternative embodiment of the invention.

In other embodiments, it may be desirable for the diffraction pattern which is formed by a diffraction grating to be asymmetric. FIG. 6 is a schematic illustration of an alternative embodiment of a beam delivery system BDS. The beam delivery system BDS depicted in FIG. 6 comprises a beam-splitting apparatus which includes first to fourth reflective diffraction gratings 41-24. The beam-splitting apparatus 41 splits an input radiation beam B into five branch radiation beams $B_a$-$B_e$. The branch radiation beams $B_a$-$B_e$ are directed to respective lithographic apparatuses by directing optics 31a-31e.

The beam delivery system BDS which is depicted in FIG. 6 is similar to the beam delivery system BDS shown in FIGS. 4A and 4B except that each diffraction grating 41-44 splits an incident radiation beam into a $0^{th}$ diffraction order and a +1 diffraction order (as opposed to a −1 diffraction order, a $0^{th}$ diffraction order and a +1 diffraction order as is shown in FIG. 4A). Each of the diffraction gratings 41-44 in the embodiment of FIG. 6 are configured to form a diffraction pattern comprising a +1 diffraction order and a $0^{th}$ diffraction order. The diffraction patterns formed at the diffraction gratings 41-44 include substantially no −1 diffraction order. The diffraction patterns are therefore asymmetric. In other embodiments the diffraction gratings 41-44 may be configured to form a diffraction pattern comprising a −1 diffraction order, a $0^{th}$ diffraction order and substantially no −1 diffraction order.

In order to form an asymmetric diffraction pattern including a +1 diffraction order and $0^{th}$ diffraction order but substantially no −1 diffraction order, a diffraction grating may be orientated such that grooves 51 in the diffraction grating are neither perpendicular to or parallel to the direction of propagation of radiation incident on the diffraction grating. For example, the azimuthal angle φ between the grooves 51 and the incident radiation may be approximately of the same order as the grazing incidence angle α with which the radiation is incident on the diffraction grating.

In addition to suppressing either a +1 or −1 diffraction order, it may be further desirable to supress higher order diffraction orders (e.g. a +2 and/or a −2 diffraction order). Higher order diffraction orders may be suppressed, for example, by providing a pitch P which is of the order of less than the wavelength of the incident radiation λ divided by the grazing incidence angle α (in radians).

The configuration of the diffraction gratings 41-44 which form the embodiment shown in FIG. 6 may be similar to the diffraction gratings discussed above with reference to FIG. 5A. For example, the diffraction gratings 41-44 may comprise a reflective surface comprising a plurality of grooves 51 formed in the reflective surface. Each groove 51 may have a substantially flat bottom portion 55 extending between inclined portions 57a, 57b. Each groove 51 may be separated by a substantially flat ridge 53 extending between adjacent grooves 51. A width $w_1$ of the flat bottom portions 55 of the grooves 51 and/or a width $w_2$ of the ridges 53 may be selected in order to select the fraction of incident radiation which is diffracted into the two diffraction orders at each diffraction grating (i.e. the split ratios of the diffraction gratings). The split ratios of the diffraction gratings 41-44 may be selected such that the powers of the branch radiation beams $B_a$-$B_e$ provided to the lithographic apparatuses $LA_a$-$LA_e$ are substantially the same as each other.

In the example which is depicted in FIG. 6, the beam-splitting apparatus comprises four diffraction gratings 41-44 which provide branch radiation beams to five lithographic apparatuses $LA_a$-$LA_e$. In other embodiments, the beam-splitting apparatus 40 may include more or fewer than four diffraction gratings which provide more or fewer than five branch radiation beams to more or fewer than five lithographic apparatuses. For example, in an embodiment the beam-splitting apparatus 40 may include nine diffraction gratings each configured to receive a radiation beam and form a $0^{th}$ diffraction order and a +1 diffraction order. The beam-splitting apparatus may provide ten branch radiation beams to ten lithographic apparatuses.

In both the embodiment shown in FIGS. 4A and 4B and in the embodiment which is shown in FIG. 6, it is desirable for the power and the pointing direction of the diffraction orders, formed at a diffraction grating, to be relatively insensitive to changes in the wavelength and/or the pointing direction of the radiation which is incident on the diffraction grating. In some embodiments, the wavelength and/or the pointing direction of the input radiation beam B may vary over time. For example, a radiation beam which is emitted from a free electron laser FEL (which may form all or part of the input radiation beam B) may undergo variations in the wavelength and/or the pointing direction of the radiation beam.

The wavelength $\lambda_{em}$ of radiation which is emitted from a free electron laser FEL is given by equation (1) above and depends on the Lorentz factory of the electrons in the undulator 24. The Lorentz factor γ of the electrons in the undulator 24 depends on the energy which electrons gain in the linear accelerator 24. The energy which electrons gain in the linear accelerator may be unstable with time. For example, the power output of an RF generator used to generate RF fields in the linear accelerator 24 may include instabilities. Consequently the Lorentz factor γ of electrons in the undulator 24 may vary with time leading to variations in the wavelength $\lambda_{em}$ of radiation emitted from the free electron laser FEL.

The pointing direction of a radiation beam which is emitted from a free electron laser FEL may vary over time due to small variations in the position of the undulator 24 relative to the an optical element which the radiation beam is incident on after having been emitted from the free electron laser FEL. Additionally or alternatively, changes in magnetic fields which are generated in the undulator 24 may lead to changes in the path of the electrons through the undulator, thereby altering the optical path of radiation in the undulator 24 and the pointing direction of radiation emitted from the undulator 24.

A diffraction grating may be configured to reduce its sensitivity to changes in the wavelength and/or the pointing direction of radiation which is incident upon it. For example, the shape of the unit cells which form a diffraction grating structure may affect the sensitivity of the relative powers of each diffraction order to changes in the wavelength and/or the pointing direction of the radiation incident on the diffraction grating. Additionally or alternatively, the shape of the unit cells which form a diffraction grating structure may affect the sensitivity of the pointing direction of each diffraction order to changes in the wavelength and/or the pointing direction of the radiation incident on the diffraction grating.

The general shape of the unit cells shown in FIG. 5A may allow a diffraction grating to be configured such that it is relatively insensitive to changes in the wavelength and/or the pointing direction of radiation which is incident on the diffraction grating (when compared to other unit cell shapes). In particular, including flat bottom portions 55 and/or ridges 53 in the unit cell shape provides extra degrees of freedom which may be tuned in order to reduce the wavelength and/or pointing direction sensitivity. A diffraction grating having the general unit cell shape which is shown in FIG. 5A, is defined by the pitch P, the width $w_1$ and the width $w_2$. If the groove angles $\theta_a$ and $\theta_b$ are determined by fixed properties of the material used to form the substrate, then the groove depth $d_1$ is uniquely determined by the pitch P, the width $w_1$ and the width $w_2$. The diffraction grating itself therefore has three degrees of freedom P, $w_1$ and $w_2$. Further degrees of freedom are provided by the orientation of the diffraction grating relative to the incident radiation. The orientation of the diffraction grating is defined by the azimuthal angle φ between the plane of incidence and the grooves 51, and the grazing incidence angle α. For radiation of a given wavelength there are therefore five degrees of freedom P, $w_1$, $w_2$, φ and α.

The free parameters which correspond to the degrees of freedom may be selected in order to provide a diffraction grating having desired properties. For example, for radiation having a given wavelength λ it may be desirable to set the free parameters so as to reduce the sensitivity of the fraction of radiation in each diffraction order to changes in the wavelength λ, the grazing incidence angle α and the azimuthal angle φ. It may be further desirable to set the free parameters so as to provide a diffraction grating which splits desired fractions of the incident radiation into the various diffraction orders. If the fraction of incident radiation which forms an $n^{th}$ diffraction order is given as $R_n$ then the above mentioned criteria may be expressed by the following equations:

$$\frac{dR_n}{d\lambda} = 0 \tag{3a}$$

$$\frac{dR_n}{d\alpha} = 0 \tag{3b}$$

$$\frac{dR_n}{d\varphi} = 0 \tag{3c}$$

$$R_n = R_{target} \tag{3d}$$

where $R_{target}$ is a target fraction of the incident radiation which forms the $n^{th}$ diffraction order.

In an embodiment in which three diffraction orders are formed at a diffraction grating (e.g. −1, $0^{th}$ and +1 diffraction orders) a total of twelve equations (a version of equations (3a)-(3d) for each diffraction order) are to be satisfied by varying the five free parameters. Suitable values for the free parameters may, for example, be found by numerical modelling of the diffraction grating. The problem may be simplified, for example, by assuming that when equation (3a) holds true so too does equation (3b), which is often the case in practice. The problem may be simplified further, for example, by setting the azimuthal angle φ to zero such that a symmetric diffraction pattern is formed. In some embodiments, the grazing incidence angle α may be set so as to reduce the amount of absorption which occurs at the diffraction grating. The grazing incidence angle α may therefore be predetermined or may be limited to a limited range of values.

In some cases it may be difficult to satisfy equation (3b) for diffraction orders which are not a $0^{th}$ diffraction order, and thus equation (3b) for higher diffraction orders may be ignored when searching for values of the free parameters. Emphasis may instead be placed on seeking values of the free parameters which satisfy equations (3a) and (3d). Using a diffraction grating which has both flat bottom portions 55 having a width $w_1$ and ridges 53 having a width $w_2$ advantageously provides enough degrees of freedom such that values of the free parameters may be found in order to satisfy equations (3a) and (3d).

Figure 5B:
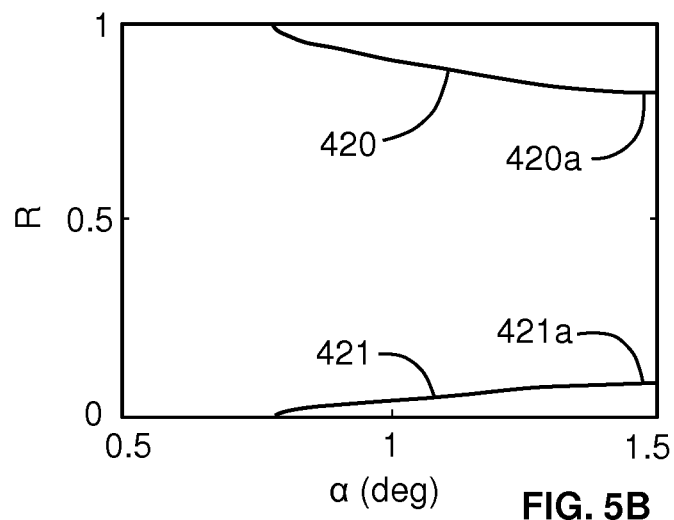
FIG. 5B is a schematic representation of the reflectance of a diffraction grating, of the type shown in FIG. 5A, as a function of a grazing incidence angle.

FIG. 5B is a schematic representation of the reflectance of an example diffraction grating as a function of the grazing incidence angle α. The line labelled 420 in FIG. 5B represents the reflectance into a $0^{th}$ diffraction order. The line labelled 421 in FIG. 5B represents the reflectance into a +1 diffraction order (a similar reflectance curve may exist for a −1 diffraction order). It can be seen from FIG. 5B that at a grazing incidence angle of close to 1.5° the gradient of both the line 420 and the line 421 is close to zero. The minimum of the curve 420

$$\left(\text{i.e. where } \frac{dR_0}{d\alpha} = 0\right)$$

is labelled 420a in FIG. 5B. The maximum of the curve 421

$$\left(\text{i.e. where } \frac{dR_1}{d\alpha} = 0\right)$$

is labelled 421a in FIG. 5B. As was mentioned above, when the reflectance is insensitive to the grazing incidence angle α, it usually follows that the reflectance is also insensitive to the wavelength of radiation. In the example which is shown in FIG. 5B, at a grazing incidence angle α which is close to 1.5° the reflectance into both the $0^{th}$ diffraction order and the +1 diffraction order may advantageously be relatively insensitive to changes in both the grazing incidence angle α and the wavelength.

The general unit cell shape (including flat bottom portions 55 and ridges 53) which is shown in FIG. 5A advantageously allows the free parameters of several diffraction gratings which form a beam-splitting apparatus to be set such that the diffraction grating provide branch radiation beams $B_a$-$B_j$ whose power and pointing direction are relatively stable with changes in the wavelength and/or pointing direction of the input radiation beam B. The unit cell shape shown in FIG. 5A is additionally advantageous since it allows the split ratio of a diffraction grating to be altered by altering the width $w_1$ of the flat bottom portions 55 and/or the width $w_2$ of the ridges 53. Diffraction gratings having different widths $w_1$ and/or different widths $w_2$ may therefore be used at different positions in a beam-splitting apparatus 40 so as to provide branch radiation beams $B_a$-$B_j$ having desired powers.

Variations in the power and/or pointing direction of diffraction orders formed at a diffraction grating, with changes in the radiation (e.g. changes in wavelength and/or pointing direction) incident on the diffraction grating may be different for different diffraction orders. Typically the power and/or pointing direction of a $0^{th}$ diffraction order is less sensitive to changes in the wavelength and/or pointing direction of an input radiation beam than a +1 or a −1 diffraction order. For example, typically the pointing direction of a $0^{th}$ diffraction order does not change at all with variations in wavelength, whereas the pointing direction of a +1 and −1 diffraction order is sensitive to changes in the wavelength.

It may be possible to configure a diffraction grating such that the power of the diffraction orders are relatively insensitive to changes in the wavelength of the incident radiation (i.e. equation (3a) is satisfied). As was mentioned above when equation (3a) is satisfied, it typically follows that equation (3b) is also satisfied. In general the power of the diffraction orders may be more sensitive to changes in the azimuthal angle φ (when compared to changes in the wavelength and the grazing incidence angle α) and thus equation (3c) may not be satisfied.

As will be described in further detail below, changes in the azimuthal angle φ of the input radiation beam which is received from a radiation source SO may be small enough that the resulting change in the power of the +1 and/or −1 diffraction orders may be relatively small. In the embodiment depicted in FIGS. 4A and 4B, the change in power of the branch radiation beams $B_a$-$B_j$ which results from variations in the azimuthal angle φ of the input radiation beam may therefore be relatively small.

In both the embodiment depicted in FIG. 4A and in the embodiment depicted in FIG. 6, each lithographic apparatus receives a branch radiation beam $B_a$-$B_j$ which corresponds to a +1 or a −1 diffraction order formed at a diffraction grating. Each diffraction grating 41-45 receives a radiation beam which is either received directly from the radiation source SO (in the case of the first diffraction grating) or corresponds with a $0^{th}$ diffraction order formed at a previous diffraction grating (in the case of the second 42, third 43, fourth 44 and fifth 45 diffraction gratings). That is, all +1 and −1 diffraction orders form branch radiation beams $B_a$-$B_j$ which are output to lithographic apparatuses and do not form an input radiation beam to a subsequent diffraction grating. The optical path of each branch radiation beam $B_a$-$B_j$ from the radiation source SO to a lithographic apparatus $LA_a$-$LA_j$ therefore only includes one instance of a +1 or a −1 diffraction order. This advantageously reduces the sensitivity of the powers and/or pointing directions of the branch radiation beams $B_a$-$B_j$ to changes in the wavelength and/or pointing direction of the input radiation beam B (when compared to alternative arrangements).

In an alternative arrangement of diffraction gratings a +1 and/or −1 diffraction order may be incident on a further diffraction grating to further split the +1 and/or −1 diffraction order into one or more branch radiation beams. For example, a $0^{th}$ diffraction order a +1 diffraction order and a −1 diffraction order formed at a first diffraction grating may provide inputs to three further diffraction gratings which each form three branch radiation beams. As was described above a change in the wavelength and/or the pointing direction of the input radiation beam may cause a larger change in the power and/or pointing direction of the +1 and −1 diffraction orders than in the $0^{th}$ diffraction order. In particular, a variation in the wavelength of the input radiation beam may cause a relatively large change in the pointing direction of the +1 and −1 diffraction orders. The pointing direction of radiation incident on a further diffraction grating will therefore undergo a larger change if the further diffraction grating receives a +1 or −1 diffraction order than if it receives a $0^{th}$ diffraction order. As was explained above the power of diffraction orders formed at a diffraction grating may, in particular, be sensitive to changes in the azimuthal angle φ of the radiation which is incident upon it. A larger change in the the pointing direction (including the azimuthal angle φ) of the input to a further diffraction grating may therefore propagate into a larger change in the power in a branch radiation beam formed at the further diffraction grating.

An alternative arrangement in which +1 and/or −1 diffraction orders are supplied to further diffraction orders may therefore, in particular, cause the power of the resultant branch radiation beams to be sensitive to changes in the wavelength of the input radiation beam. In contrast to such an arrangement, only using $0^{th}$ diffraction orders as inputs to further diffraction gratings (e.g. as shown in FIG. 4A and FIG. 6) advantageously increases the stability of the power and/or pointing direction of the branch radiation beams $B_a$-$B_j$ with changes in the wavelength and/or pointing direction of the input radiation beam B.

The arrangements which are shown in FIGS. 4A and 6 also advantageously provide flexibility as to the number of lithographic apparatuses which are supplied with branch radiation beams. For example, the number of lithographic apparatuses may be easily increased or decreased by increasing or decreasing the number of diffraction gratings used. A change in the number of lithographic apparatuses may require a change in the configuration of the diffraction gratings (e.g. the split ratios of the diffraction gratings) used in order to provide a different number of branch radiation beams each having a desired power. Changing the number of lithographic apparatuses which are supplied with branch radiation beams may be simpler using arrangements specified herein as opposed to prior art arrangements of lithographic systems. For example, further lithographic apparatuses may be added to a lithographic system without moving the position of the other lithographic apparatuses. This may not be possible using prior art arrangements of a lithographic system.

Additionally, each of the directing optics 31a-31j may be supplied with a branch radiation beam $B_a$-$B_j$ which propagates at substantially the same angle with respect to the z-direction. This may allow each of the directing optics 31a-31j to be similar to each other or substantially the same as each other. Consequently the design and manufacture of the directing optics 31a-31j may be advantageously simplified.

Embodiments have been described above in which the power of radiation which is diffracted to form different diffraction orders is determined by the shape of a unit cell of a diffraction grating used to diffract the radiation. In addition to being a function of the unit cell shape, the power of radiation which is diffracted into different diffraction orders is also a function of the grazing incidence angle $\alpha$ and the azimuthal angle $\varphi$ with which the radiation is incident on the diffraction grating. In some embodiments, the dependence of the power in each diffraction order on the grazing incidence angle $\alpha$ and the azimuthal angle $\varphi$ may be used to control the power of radiation in each diffraction order. For example, a diffraction grating may be provided with one or more actuators operable to alter the orientation of the diffraction grating so as to alter the grazing incidence angle $\alpha$ and/or the azimuthal angle $\varphi$ with which radiation is incident on the diffraction grating. Consequently the power of radiation which is diffracted into each diffraction order may be adjusted by adjusting the grazing incidence angle $\alpha$ and/or the azimuthal angle $\varphi$. This may allow the power of the branch radiation beams to be dynamically controlled.

Dynamic control of the power of branch radiation beams may be used to adjust the fraction of a main radiation beam which is split into a given branch radiation beam in response to changes in the power of the main radiation beam. For example, if the power of a main radiation beam emitted from a radiation source increases, this increase may be measured and the orientation of one or more diffraction gratings forming a beam delivery system may be adjusted in response to the measured increase. For example, the orientation of one or more diffraction gratings may be adjusted so as to decrease the fraction of the main radiation beam which is split into a given branch radiation beam in order to compensate for the increase in power of the main radiation beam. Consequently the power of the given branch radiation beam may be kept substantially stable with time. In other embodiments, dynamic control of the power of one or more branch radiation beams may be used for other purposes. For example, dynamic control of the power of one or more branch radiation beams may be used to adjust the power of one or more branch radiation beams to meet changing requirements of a lithographic apparatus.

In some embodiments, the power of one or more branch radiation beams may not be dynamically controlled, however the orientation of one or more diffraction gratings which form a beam delivery system may be selected in order to provide branch radiation beams having desired powers. For example, the orientation of one or more diffraction gratings may be selected such that a desired fraction of an incoming radiation beam is split into different diffraction orders.

In general, the orientation of one of more diffraction gratings may be used to control the grazing incidence angle $\alpha$ and/or the azimuthal angle $\varphi$ with which radiation is incident on the diffraction grating, so as to control the amount of radiation which is split into a plurality of diffraction orders. The orientation may be controlled dynamically or may be pre-selected to provide a desired result.

In some embodiments, a diffraction grating may be configured such that the split-ratio of the diffraction grating changes as a function of the grazing incidence angle $\alpha$ at which radiation is incident on the diffraction grating. A diffraction grating may, for example be configured such that the split ratio varies between a grazing incidence angle of $\alpha_1$ and a grazing incidence angle of $\alpha_2$, where $\alpha_2 > \alpha_1$.

As was described above, in general an amount of radiation which is absorbed at a diffraction grating increases with increasing grazing incidence angle $\alpha$. In order to limit the amount of radiation which is lost to absorption both $\alpha_2$ and $\alpha_1$ may be relatively small. For example, $\alpha_2$ and $\alpha_1$ may both be less than about 5 degrees and may be less than about 4 degrees. In some embodiments, $\alpha_2$ may be approximately 70 milliradians (approximately 4 degrees) and $\alpha_1$ may be approximately 17 milliradians (approximately 1 degree).

A diffraction grating may be configured such that within the range $\alpha_1 < \alpha < \alpha_2$, the maximum diffraction into a $0^{th}$ diffraction order (specular reflection) occurs at a grazing incidence angle $\alpha$ of about $\alpha_1$ and the minimum diffraction into a $0^{th}$ diffraction order (specular reflection) occurs at a grazing incidence angle $\alpha$ of about $\alpha_2$. That is, the maximum diffraction into a +1 and/or a −1 diffraction orders occurs at a grazing incidence angle $\alpha$ of about $\alpha_2$ and the minimum diffraction into a +1 and/or a −1 diffraction orders occurs at a grazing incidence angle $\alpha$ of about $\alpha_1$.

These conditions may be met by configuring the pitch of the diffraction grating such that the $0^{th}$ order diffraction is suppressed at grazing incidence angles of $\alpha < \alpha_1$. This may be achieved, for example, if the pitch P is set to be approximately equal to $P = \lambda/\alpha_1$ where $\lambda$ is the wavelength of the radiation to be diffracted and $\alpha_1$ is in radians.

As was described above, the angles $\theta_a$ $\theta_b$ of side-walls of grooves in a diffraction grating may be determined by the orientation of crystallographic planes of the material from which the substrate is formed. The orientation of crystallographic planes in the substrate may be an inherent property of the material of the substrate and may not therefore be a freely variable parameter. The depth $d_1$ of the grooves is a variable parameter which may be chosen to provide desired optical properties. For, example the depth $d_1$ of grooves in the substrate may be chose such that $0^{th}$ order diffraction (specular reflection) is suppressed at a grazing incidence angle of about $\alpha_2$. This condition may be met, for example, if the following relation is satisfied:

$$\frac{\alpha_2 d_1}{\lambda} \approx \frac{j}{2} + \frac{1}{4} \quad (4)$$

where j is an integer greater than or equal to 0 and $\alpha_2$ is in radians. In some embodiments, the relation in equation (4) may be satisfied by setting j=0 such that the depth $d_1$ is set at approximately $d_1 = \lambda/4\alpha_2$.

A diffraction grating may be configured to receive radiation having a wavelength of 13.5 nm at grazing incidence angles in the range $\alpha_1$=17 milliradians and $\alpha_2$=70 milliradians. Using the relations given above, such a diffraction grating may have a pitch P of approximately 794 nm and a groove depth $d_1$ of approximately 48 nm.

The precise dimensions which provide desired optical properties may differ slightly from the relations given above, which should be considered to be approximations. For example, in some embodiments dimensions which provide desired optical properties may differ from the relations given above by up to about a factor of 2. In practice the precise dimensions of a diffraction grating which has desired optical properties may be found using an element of trial and error and/or by conducting computer simulations of the optical properties of a diffraction grating.

A diffraction grating of the type contemplated above may be used to provide branch radiation beams having desired powers. For example, a diffraction grating may be provided with one or more actuators operable to alter the grazing incidence angle of incident radiation (e.g. in the range $\alpha_1<\alpha<\alpha_2$) so as to alter the amount of radiation which is diffracted into different diffraction orders. In some embodiments a plurality of substantially similar diffraction gratings may be used to form a beam delivery system of the type shown in FIGS. 4 and 6. One or more of the diffraction gratings may be arranged at different grazing incidence angles such that the split ratios at the different diffraction gratings are different. The plurality of diffraction gratings may be arranged such that grazing incidence angles at the diffraction gratings lie in the range $\alpha_1<\alpha<\alpha_2$.

Figure 7:
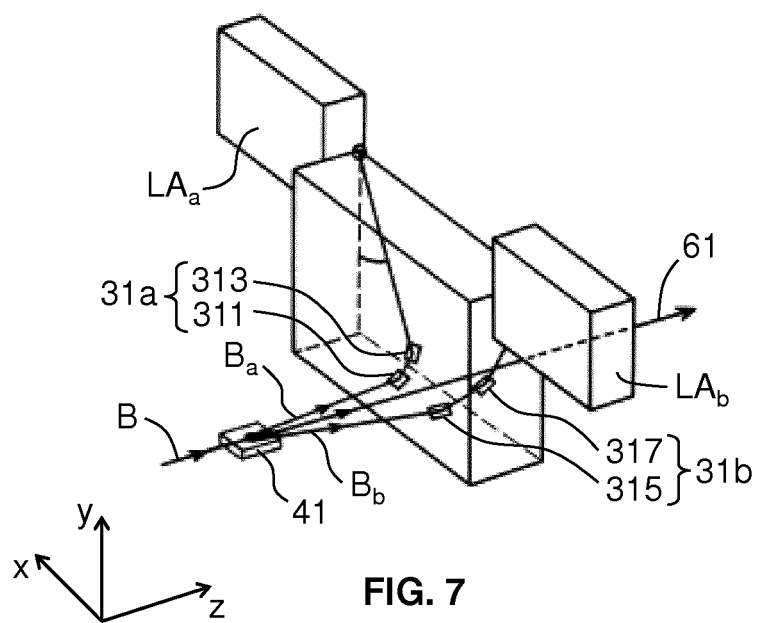
FIG. 7 is a schematic illustration of a portion of a beam delivery system.

FIG. 7 is a schematic illustration of a portion of a beam delivery system BDS which includes directing optics. The portion of the beam delivery system BDS shown in FIG. 7 may, for example, correspond to a portion of the beam delivery system BDS which is shown in FIGS. 4A and 4B. An input radiation beam is incident on a first diffraction grating 41. The first diffraction grating 41 forms a diffraction pattern comprising a first branch radiation beam $B_a$ (which may, for example, comprise a +1 diffraction order), a second branch radiation beam $B_b$ (which may, for example, comprise a −1 diffraction order) and a sub-beam 61 (which may, for example, comprise a $0^{th}$ diffraction order).

The first branch radiation beam $B_a$ is directed to a first lithographic apparatus $LA_a$ with first directing optics 31a. The second branch radiation beam $B_b$ is directed to a second lithographic apparatus $LA_b$ with second directing optics 31b. The first directing optics 31a comprises a first reflective element 311 and a second reflective element 313. The first reflective element 311 is arranged to receive the first branch radiation beam $B_a$ from the first diffraction grating 41 and reflect the branch first radiation beam $B_a$ to be incident on the second reflective element 313. The second reflective element is arranged to reflect the first branch radiation beam $B_a$ so as to direct the first branch radiation beam $B_a$ to the first lithographic apparatus $LA_a$.

The second directing optics 31b comprises a third reflective element 315 and a fourth reflective element 317. The fourth reflective element 315 is arranged to receive the second branch radiation beam $B_b$ from the first diffraction grating 41 and reflect the second branch radiation beam $B_b$ to be incident on the fourth reflective element 317. The fourth reflective element 317 is arranged to reflect the second branch radiation beam $B_b$ so as to direct the second branch radiation beam $B_a$ to the second lithographic apparatus $LA_a$.

In some embodiments, the first directing optics 31a and/or the second directing optics 31b may include more reflective elements than those shown in FIG. 7.

The input radiation beam B which is received at the first diffraction grating may be polarized. For example, the input radiation beam B may be emitted from a free electron laser FEL which emits polarized radiation. The polarization state of radiation which is emitted from a free electron laser FEL depends on the configuration of an undulator 24 which forms part of the free electron laser FEL. In particular, the polarization state of radiation which is emitted from a free electron laser FEL may depend on the nature of the path along which electrons are directed through the undulator. For example, if the electrons follow a planar path through the undulator 24 then the free electron laser FEL may emit linearly polarized radiation. If the electrons follow a helical path through the undulator 24 then the free electron laser FEL may emit elliptically or circularly polarized radiation.

The polarization state of radiation which is emitted from a free electron laser FEL may undergo changes during interactions at optical elements. For example, the polarization state of the input radiation beam B may be altered at the first diffraction grating. The polarization state of the first and second branch radiation beams $B_a$, $B_b$ may undergo changes during reflection at the reflective elements 311, 313, 315, 317.

Polarized radiation which is incident on a reflective element may be considered to comprise a p-polarized component and an s-polarized component. The p-polarized component and the s-polarized component are defined relative to a plane of incidence at the reflective element. The plane of incidence at a reflective element is the plane in which both radiation incident on the reflective element and radiation reflected from the reflective element lies. The component of the electric field vector which is parallel to the plane of incidence forms the p-polarized component and the component of the electric field vector which is perpendicular to the plane of incident forms the s-polarized component.

Reflection at a reflective element may induce a phase change between p and s-polarized components. A phase change induced between p and s-polarized components may be referred to as a retardance. The phase difference between p and s-polarized components affects the polarization state of the radiation. For example, linearly polarized radiation comprises p and s-polarized components which are in phase with each other. Circularly polarized radiation comprises p and s-polarized components which are out of phase with each other (i.e. a phase difference of $\pi/2$). Elliptically polarized radiation may, for example, comprise p and s-polarized components which have a phase difference of between 0 and $\pi/2$. A retardance induced at a reflective element may therefore convert linearly polarized radiation to elliptically or circularly polarized radiation and may convert circularly polarized radiation to elliptically or linearly polarized radiation. Elliptically polarized radiation which undergoes a phase retardance may be converted to linearly or circularly polarized radiation. Alternatively an ellipticity of an elliptical polarization state may be altered by an induced phase retardance.

It may be desirable for radiation which is provided to each lithographic apparatus to have a given polarization state. The polarization state of radiation which is provided to a lithographic apparatus may be controlled by controlling the polarization state of the input radiation beam B and controlling the phase retardance induced along the optical path of radiation to a lithographic apparatus. However, as will be explained with reference to FIG. 8, the phase retardance induced along the optical path of a branch radiation beam to a lithographic apparatus may be different for different lithographic apparatuses. Consequently the polarization state of different branch radiation beams provided to different lithographic apparatuses may be different from each other.

Figure 8:
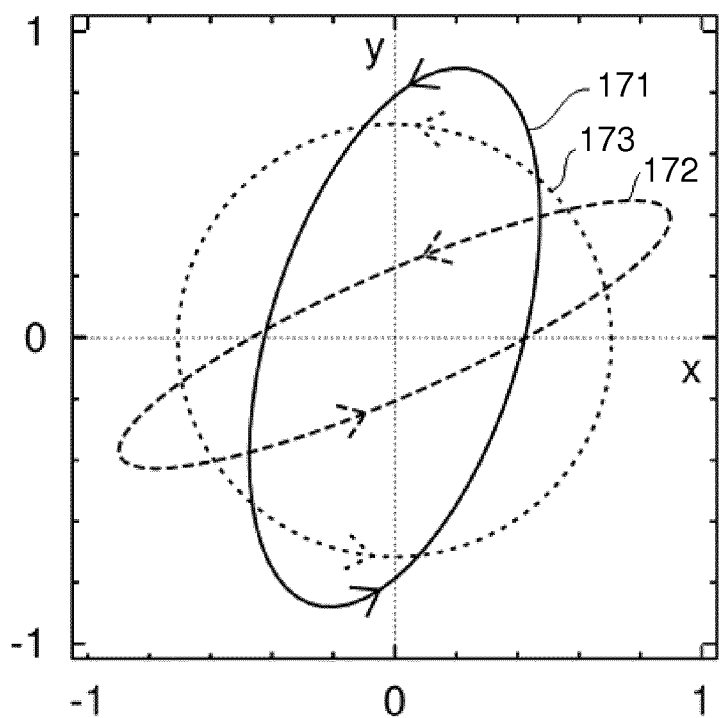
FIG. 8 is a schematic representation of the polarization state of radiation beams at different positions in the beam delivery system of FIG. 7.

FIG. 8 is a schematic representation of the polarization state of radiation at different points in the beam delivery system BDS shown in FIG. 7. The polarization states are represented by the shape which is traced out by an electric field vector in a plane perpendicular to the direction of propagation of the radiation. The solid line labeled 171 in FIG. 8 represents the polarization state of the input radiation beam B which is incident on the first diffraction grating 41. The dashed line labeled 172 in FIG. 8 represents the polarization state of the first branch radiation beam $B_a$ which is provided to the first lithographic apparatus $LA_a$. The dotted line labeled 173 in FIG. 8 represents the polarization state of the second branch radiation beam $B_b$ which is provided to the second lithographic apparatus $LA_b$. It will be appreciated that whilst the polarization states of the input radiation beam B, the first branch radiation beam $B_a$ and the second branch radiation beam $B_b$ are displayed on the same plot, the directions of propagation of these radiation beams are, in practice, different from each other.

It can be seen from FIG. 8 that the polarization states of the first branch radiation beam $B_a$ and the second branch radiation beam $B_b$ are different from the polarization state of the input radiation beam B. This is due to a retardance which is induced in the branch radiation beams $B_a$, $B_b$ at the first diffraction grating 41 and at the directing optics 31a, 31b. In the example which is shown in FIG. 8, the polarization state of the input radiation beam B is chosen such that the second branch radiation beam $B_b$, which is provided to the second lithographic apparatus $LA_b$, has a circular polarization state. In some embodiments, it may be desirable to provide a lithographic apparatus with circularly polarized radiation. In other embodiments, it may be desirable to provide a lithographic apparatus with radiation having a different polarization state. For example, it may be desirable to provide a lithographic apparatus with radiation having a given elliptical polarization state.

In the example which is shown in FIG. 8 it is assumed that it is desirable to provide a lithographic apparatus with circularly polarized radiation and the polarization state of the input radiation beam B is chosen so as to provide the second lithographic apparatus $LA_b$ with circularly polarized radiation. However, as can be seen in FIG. 8, the polarization state of the radiation which is provided to the first lithographic apparatus $LA_a$ is different to the polarization state of the radiation which is provided to the second lithographic apparatus $LA_b$. Whilst the second lithographic apparatus $LA_b$ is provided with circularly polarized radiation, the first lithographic apparatus $LA_a$ is provided with elliptically polarized radiation. This is due to differences in the retardance induced in the first and second branch radiation beams $B_a$, $B_b$ along their optical paths to the first and second lithographic apparatuses $LA_a$, $LA_b$. Consequently there is no polarization state of the input radiation beam B which will result in both the first and second lithographic apparatuses $LA_a$, $LA_b$ being provided with radiation having the same desired polarization state.

Figure 9:
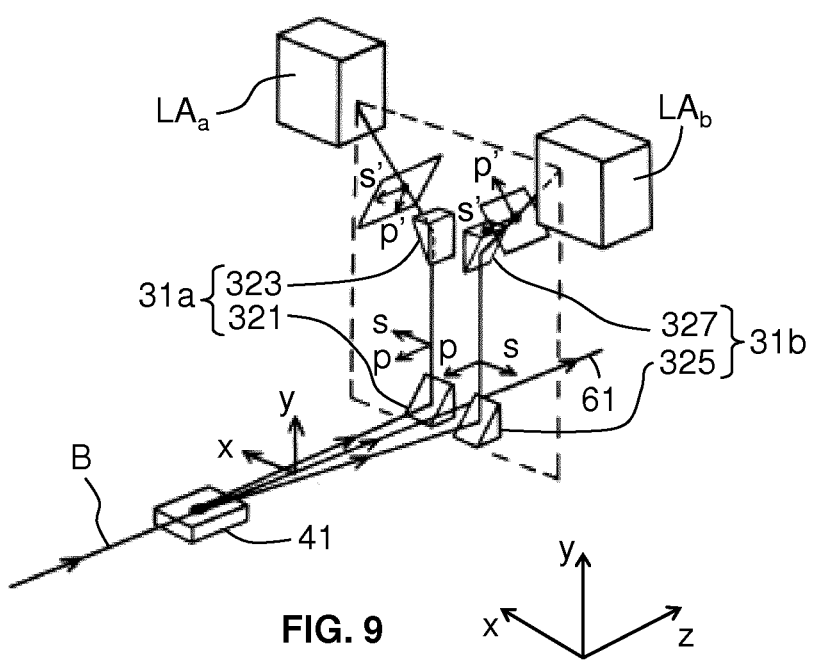
FIG. 9 is a schematic illustration of a portion of a beam delivery system according to an embodiment of the invention.

FIG. 9 is a schematic illustration of a portion of a beam delivery system which is configured to provide first and second lithographic apparatuses with radiation having substantially the same polarization state. The beam delivery system shown in FIG. 9 includes a first reflective diffraction grating 41 which is arranged to receive an input radiation beam B. The first diffraction grating 41 forms a diffraction pattern comprising a first branch radiation beam $B_a$ (which may, for example, comprise a +1 diffraction order), a second branch radiation beam $B_b$ (which may, for example, comprise a −1 diffraction order) and a sub-beam 61 (which may, for example, comprise a $0^{th}$ diffraction order).

The first branch radiation beam $B_a$ is directed to a first lithographic apparatus $LA_a$ by first directing optics 31a. The second branch radiation beam $B_b$ is directed to a second lithographic apparatus $LA_b$ by second directing optics 31b. The first directing optics 31a comprises a first reflective element 321 and a second reflective element 323. The first reflective element 321 is arranged to receive the first branch radiation beam $B_a$ from the first diffraction grating 41 and reflect the branch first radiation beam $B_a$ to be incident on the second reflective element 323. The second reflective element is arranged to reflect the first branch radiation beam $B_a$ so as to direct the first branch radiation beam $B_a$ to the first lithographic apparatus $LA_a$.

The second directing optics 31b comprises a third reflective element 325 and a fourth reflective element 327. The fourth reflective element 325 is arranged to receive the second branch radiation beam $B_b$ from the first diffraction grating 41 and reflect the second branch radiation beam $B_b$ to be incident on the fourth reflective element 327. The fourth reflective element 327 is arranged to reflect the second branch radiation beam $B_b$ so as to direct the second branch radiation beam $B_a$ to the second lithographic apparatus $LA_a$.

In the embodiment which is shown in FIG. 9, the directing optics 31a, 31b are arranged such that a retardance introduced, by the first directing optics 31a, in the first branch radiation beam $B_a$ along the optical path of the first branch radiation beam $B_a$ to the first lithographic apparatus $LA_a$, is substantially the same as a retardance introduced, by the second directing optics, in the second branch radiation beam along the optical path of the second branch radiation beam $B_b$ to the second lithographic apparatus $LA_b$.

The retardance which is induced in the first and second branch radiation beams $B_a$, $B_b$ is determined, at least in part, by the orientation of the reflective elements 321, 323, 325, 327 relative to the radiation which is incident upon them. As was explained above with reference to FIG. 7, the polarization state at each reflective element may be decomposed into a p-polarized and an s-polarized component relative to the plane of incidence at each reflective element. In the arrangement which is shown in FIG. 9, the plane of incidence at the first reflective element 321 is substantially perpendicular to the plane of incidence at the second reflective element 323. Consequently, the p and s-polarized components at the second reflective element 323 correspond with the s and p-polarized components at the first reflective element 321 respectively.

The p and s-polarized components which are reflected at the first reflective element 321 are labeled as such in FIG. 9.

The labeled p and s-polarized components represent the orthogonal components between which a phase difference is induced at the first reflective element 321. The p and s-polarized components which are reflected at the second reflective element 323 are labeled as p' and s' in FIG. 9. The plane of incidence at the second reflective element 323 is perpendicular to the plane of incidence at the first reflective element 321. Consequently, the p' component at the second reflective element 323 corresponds with the s component at the first reflective element 321. Similarly, the s' component at the second reflective element 323 corresponds with the p component at the first reflective element 321. The orthogonal polarization components between which a phase change is induced at the first reflective element 321 are therefore the same as the orthogonal polarization components between which a phase change is induced at the second reflective element 323.

Since the planes of incidence at the first and second reflective elements 321, 323 are perpendicular to each other, the direction of the phase change which is induced in the orthogonal polarization components are opposite at the first and second reflective elements 321, 323. That is, the retardance induced at the second reflective element 323 acts to oppose the retardance which is induced at the first reflective element 321. However, the magnitude of the phase change induced at the first reflective element 321 may be different to the phase change induced at the second reflective element 323 such that there is a net retardance which results from reflection at the first and second reflective elements 321, 323. The magnitude of the retardance which is induced during reflection at a reflective element depends on the grazing incidence angle at which the radiation is incident on the reflective element. At small grazing incidence angles the magnitude of the retardance may be approximately proportional to the grazing incidence angle.

In the embodiment which is shown in FIG. 9, the orientation of the second directing optics 31b is a mirror image of the orientation of the first directing optics 31a, where the plane of reflection is the y-z plane in which the input radiation beam B lies. Whilst reference is made to the orientations of the directing optics being mirror images of each other, the positions of the directing optics may not be mirror images of each other. For example, the third reflective element 325 may be located at a different position in the z-direction to the position in the z-direction of the first reflective element 321. However, the orientation of the third reflective element 325 may be a mirror image of the orientation of the first reflective element 321. For example, the grazing incidence angle of the second branch radiation beam B$_b$ at the third reflective element 325 may be the same as the grazing incidence angle of the first branch radiation beam B$_a$ at the first reflective element 321. An angle which the plane of incidence at the third reflective element 325 forms with the z-direction may be equal and opposite to an angle which the plane of incidence at the first reflective element 321 forms with the z-direction.

The p and s-polarized components after reflection at the third reflective element are labeled p and s in FIG. 9. The p and s-polarized components after reflection at the fourth reflective element 327 are labeled p' and s' in FIG. 9. The third and fourth reflective elements 325, 327 are arranged such that the plane of incidence at the third reflective element 325 is substantially perpendicular to the plane of incidence at the fourth reflective element 327. Consequently, the p' component at the fourth reflective element corresponds with the s component at the third reflective element 325. The s' component at the fourth reflective element corresponds with the p component at the third reflective element 325. As was the case with first directing optics 31a, a phase difference is therefore induced between the same orthogonal components at both the third and fourth reflective elements 325, 327. The direction of the phase difference induced at the fourth reflective element 327 is opposite to the direction of the phase difference induced at the third reflective element 325. The magnitude of the phase difference induced at the fourth reflective element 327 may be different to the magnitude of the phase difference induced at the third reflective element 325 such that a net retardance results from reflection at the third and fourth reflective elements 325, 327.

As was described above, the orientation of the second directing optics is a mirror image of the orientation of the first directing optics. Consequently, the grazing incidence angle at the third reflective element 325 is the same as the grazing incidence angle at the first reflective element 321. Similarly, the grazing incidence angle at the fourth reflective element 327 is the same as the grazing incidence angle at the second reflective element 323. If the optical properties of each of the reflective elements are approximately the same (e.g. they each have the same composition) then the retardance induced at the third reflective element 325 will be the same as the retardance induced at the first reflective element 321. Similarly the retardance induced at the fourth reflective element 327 will be the same as the retardance induced at the second reflective element 323. The retardance introduced by the first directing optics 31a in the first branch radiation beam B$_a$ is therefore substantially the same as the retardance introduced by the second directing optics 31b in the second branch radiation beam B$_b$. The first lithographic apparatus LA$_a$ and the second lithographic apparatus LA$_b$ are therefore provided with branch radiation beams having substantially the same polarization state. The polarization state of the input radiation beam B may be set such that radiation having a desired polarization state is provided to both the first and second lithographic apparatuses LA$_a$, LA$_b$.

Figure 10:
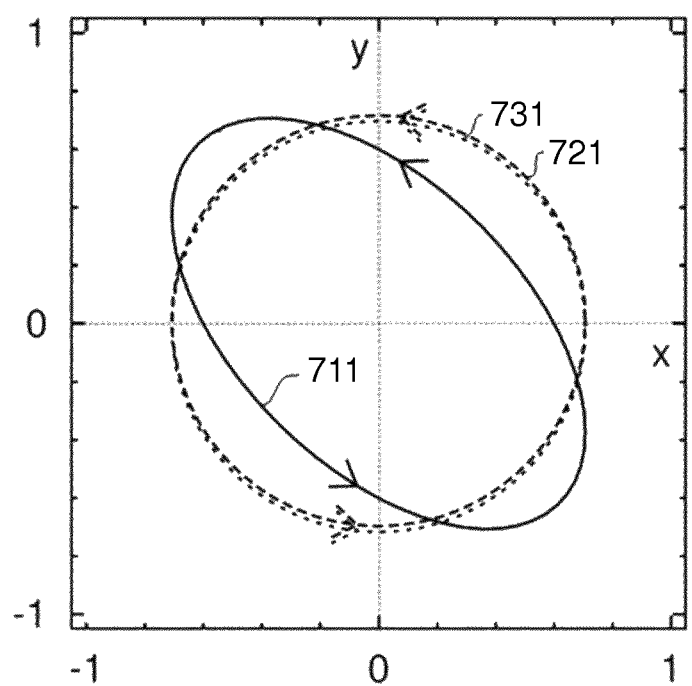
FIG. 10 is a schematic representation of the polarization state of radiation beams at different positions in the beam delivery system of FIG. 9.

FIG. 10 is a schematic representation of the polarization state of radiation at different points in the beam delivery system BDS shown in FIG. 9. The polarization states are represented by the shape which is traced out by an electric field vector in a plane perpendicular to the direction of propagation of the radiation. The solid line labeled 711 in FIG. 10 represents the polarization state of the input radiation beam B which is incident on the first diffraction grating 41. The dashed line labeled 721 in FIG. 10 represents the polarization state of the first branch radiation beam B$_a$ which is provided to the first lithographic apparatus LA$_a$. The dotted line labeled 731 in FIG. 10 represents the polarization state of the second branch radiation beam B$_b$ which is provided to the second lithographic apparatus LA$_b$. It will be appreciated that whilst the polarization states of the input radiation beam B, the first branch radiation beam B$_a$ and the second branch radiation beam B$_b$ are displayed on the same plot, the directions of propagation of these radiation beams are, in practice, different from each other.

As can be seen in FIG. 10, the polarization state of the first branch radiation beam B$_a$ provided to the first lithographic apparatus LA$_a$ is substantially the same as the polarization state of the second branch radiation beam B$_b$ provided to the second lithographic apparatus LA$_b$. In the plot which is shown in FIG. 10 the lines showing the polarization states of the first and second branch radiation beams are deliberately separated slightly in order for them both to be seen in the plot. However, the polarization states may in practice be the same. In the example, which is shown in FIG. 10 the polarization state of the input radiation beam B is selected such that the branch radiation beams $B_a$, $B_b$ provided to the lithographic apparatuses $LA_a$, $LA_b$ are substantially circularly polarized. In other embodiments, the polarization state of the input radiation beam B may be selected such that the branch radiation beams $B_a$, $B_b$ provided to the lithographic apparatuses $LA_a$, $LA_b$ have a polarization state other than circular polarization. For example, the polarization state of the input radiation beam B may be selected such that the branch radiation beams $B_a$, $B_b$ provided to the lithographic apparatuses $LA_a$, $LA_b$ have a desired elliptical polarization state.

Whilst the beam delivery system which is shown in FIG. 9 comprises first and second directing optics 31a, 31b which each comprise two reflective elements, other embodiments may include more or fewer reflective elements. For example, the first, second, third and/or fourth reflective elements 321, 323, 325, 327 may each be replaced by a plurality of reflective elements. For example, a reflective element may be replaced by a plurality of reflective elements at which a branch radiation beam is sequentially reflected so as to bring about a desired change in propagation direction of the branch radiation beam. In some embodiments, the first and/or the third reflective elements 321, 325 may be replaced by a sequence of, for example, eight reflective elements. The grazing incidence angles at each of the eight reflective elements will be significantly less than the grazing incidence angle when a single reflective element is used. As was mentioned above, typically the absorption of EUV radiation at a reflective element increases with increasing grazing incidence angles. The use of multiple reflective elements which serves to reduce the grazing incidence angle at each reflective element may therefore advantageously reduce the total absorption of radiation at the reflective elements, despite the radiation undergoing a greater number of reflections.

Figure 11:
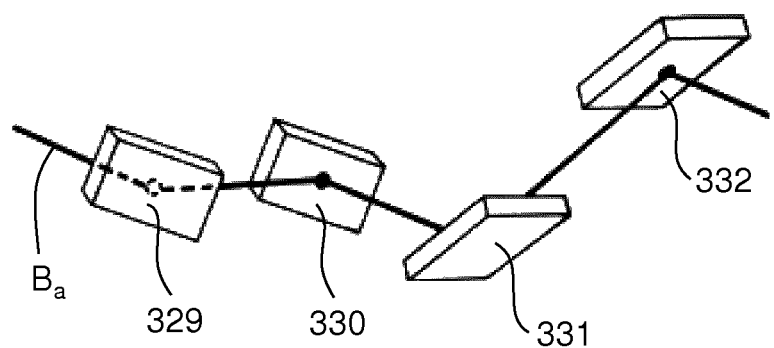
FIG. 11 is a schematic illustration of reflective elements which may form part of a beam delivery system.

In some embodiments the first and/or the second directing optics may include further reflective elements which are configured to condition the branch radiation beams prior to providing them to the lithographic apparatuses. FIG. 11 is a schematic illustration of further reflective elements 329-332 which may form part of the first directing optics 31a. The further reflective elements 329-332 each receive the first branch radiation beam $B_a$ and reflect the first branch radiation beam $B_a$, thereby defining a plane of incidence at each reflective element. In the example which is shown in FIG. 11, the plane of incidence at a fifth reflective element 329 lies in substantially the same plane as the plane of incidence at a sixth reflective element 330. The plane of incidence at a seventh reflective element 331 lies in substantially the same plane as the plane of incidence at an eighth reflective element 332. The planes of incidence at the fifth 329 and sixth 330 reflective elements are substantially perpendicular to the planes of incidence at the seventh 331 and eighth 332 reflective elements.

The planes of incidence at each of the fifth to eighth reflective elements 329-332 are therefore either parallel with each other or are perpendicular to each other. Consequently, the orthogonal polarization components between which a phase difference is introduced are the same at each reflective element. The phase differences which are introduced at the fifth 329 and sixth 330 reflective elements act in the same direction as each other. The phase differences which are introduced at the seventh 331 and eighth 332 reflective elements act in the same direction as each other. The phase differences which are introduced at the seventh 331 and eighth 332 reflective elements act in the opposite direction to the phase differences which are introduced at the fifth 329 and sixth 330 reflective elements. In some embodiments, the sum of the phase differences introduced at the fifth 329 and sixth 330 reflective elements are substantially equal and opposite to the phase differences introduced at the seventh 331 and eighth 332 reflective elements. The net effect of the fifth to eighth reflective elements 329-333 may therefore be to introduce substantially no retardance to the branch radiation beam $B_a$.

In embodiments in which further reflective elements (e.g. the fifth to eighth reflective elements 329-333) are included which together are configured not to introduce a net change in the polarization of a radiation beam, these further reflective elements may not necessarily be arranged in a particular manner relative to the other reflective elements. For example, the s and p components at the fifth to eighth reflective elements 329-333 may not correspond to the s and p components at other reflective elements which form the directing optics. The fifth to eighth reflective elements may be considered to act independently of the other reflective elements and may be considered as a whole to be polarization neutral components which have no net effect on the polarization state of the branch radiation beams.

In other embodiments the fifth to eighth reflective elements 329-333 may introduce a net retardance. The second directing optics 31b may include similar further reflective elements to those shown in FIG. 11. In embodiments in which the further reflective elements introduce a net phase retardance, the further reflective elements included in the first directing optics may be arranged to introduce substantially the same net retardance as the further reflective elements included in the second directing optics.

The further reflective elements may be configured to alter one or more properties of a branch radiation beam. For example, the further reflective elements may be configured to alter the cross-sectional shape of a branch radiation beam so as to provide a lithographic apparatus with a branch radiation beam having a desired cross-sectional shape. In some embodiments, the further reflective elements may be configured to convert a branch radiation beam having an elliptical cross-sectional shape to a branch radiation beam having a circular cross-sectional shape.

Whilst specific embodiments of directing optics 31a, 31b have been described above in which the orientation of the first directing optics is a mirror image of the orientation of the second directing optics, in other embodiments other orientations may be used. In general any orientation of reflective elements may be used which introduce a retardance in a first branch radiation beam and a retardance in a second branch radiation beam, where the retardance introduced into the first branch radiation beam is substantially the same as the retardance introduced into the second branch radiation beam.

In some embodiments the reflective elements of the first and second directing optics may be orientated such that the plane of incidence at each reflective element is either substantially parallel with or perpendicular to the plane of incidence at the previous (i.e. the immediately preceding) reflective element from the branch radiation beam is received. For example, the first directing optics may comprise a first reflective element arranged to initially receive and reflect the first branch radiation beam $B_a$ and one or more further reflective elements arranged to successively receive and reflect the first branch radiation beam $B_a$. The one or more further reflective elements may be orientated such that the plane of incidence at each of the one or more further reflective elements lies either substantially parallel to or substantially perpendicular to the plane of incidence at the reflective element from which the first branch radiation beam $B_a$ was last reflected. In such an arrangement a phase difference is induced between the same orthogonal polarization components at each reflective element.

The second directing optics may comprise a second reflective element arranged to initially receive and reflect the second branch radiation beam $B_b$ and one or more further reflective elements arranged to successively receive and reflect the second branch radiation beam $B_b$. The one or more further reflective elements may be orientated such that the plane of incidence at each of the one or more further reflective elements lies either substantially parallel to or substantially perpendicular to the plane of incidence at the reflective element from which the second branch radiation beam $B_b$ was last reflected. In such an arrangement a phase difference is induced between the same orthogonal polarization components at each reflective element.

In such arrangements the orientations of the reflective elements may be selected such that the retardance introduced by the first directing optics 31$a$ in the first branch radiation beam $B_a$ and the retardance introduced by the second directing optics 31$b$ in the second branch radiation beam $B_b$ are substantially the same as each other. This advantageously allows branch radiation beams having substantially the same polarization state to be provided to a plurality of lithographic apparatuses. The polarization state of the input radiation beam B may be selected such that each lithographic apparatus receives radiation having a desired polarization state.

In the discussion which has been provided above, only the retardance which is introduced by the directing optics 31$a$, 31$b$ has been considered. In addition to the retardance caused by the directing optics 31$a$, 31$b$, the diffraction of radiation at a diffraction grating may also introduce a retardance. For example, diffraction orders formed at a diffraction grating may include a retardance relative to an input radiation beam which is incident on the diffraction grating. Typically a retardance which is introduced into a +1 diffraction order is substantially the same as a retardance introduced into a −1 diffraction order (e.g. if an azimuthal angle φ between the grooves of the diffraction grating and the plane of incidence is substantially equal to zero). The same retardance is therefore introduced into the first and second branch radiation beams $B_a$, $B_b$ by the first diffraction grating 41. The branch radiation beams $B_a$, $B_b$ which are provided to the directing optics 31$a$, 31$b$ therefore have substantially the same polarization state.

Figure 12A:
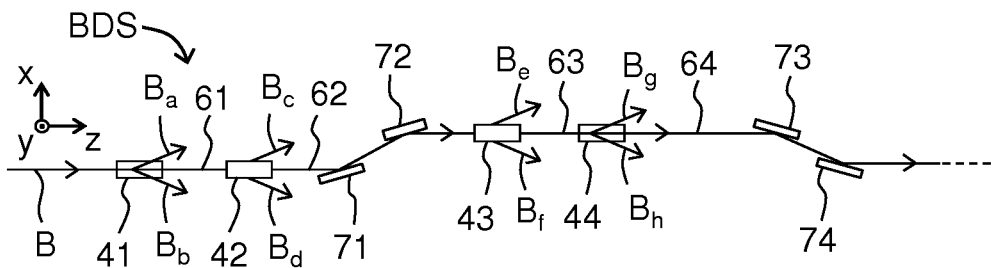
FIGS. 12A and 12B are schematic illustrations of a beam delivery system according to an embodiment of the invention.
Figure 12B:
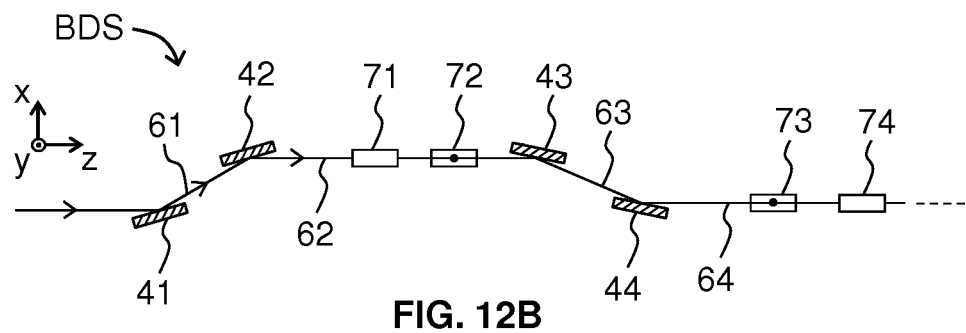

In the embodiment depicted in FIG. 9 only branch radiation beams $B_a$, $B_b$ which are formed at a single diffraction grating are depicted and described. In some embodiments the sub-beam 61 which is formed at the first diffraction grating 41 may be incident on a further diffraction grating at which further branch radiation beams are formed. FIGS. 12A and 12B are schematic illustrations of a portion of a beam delivery system BDS comprising multiple diffraction gratings. FIG. 12A shows a top-down view of the beam delivery system BDS and a FIG. 12B shows a side-on view of the beam delivery system BDS. Cartesian co-ordinates are used consistently in FIGS. 12A and 12B.

An input radiation beam B is incident on a first diffraction grating 41. The first diffraction grating 41 forms a diffraction pattern comprising a first branch radiation beam $B_a$, a second branch radiation beam $B_b$ and a first sub-beam 61. The first sub-beam 61 is incident on a second diffraction grating 42. The second diffraction grating 42 forms a diffraction pattern comprising a third branch radiation beam $B_c$, a fourth branch radiation beam $B_d$ and a second sub-beam 62. The second sub-beam 62 is directed to be incident on a third diffraction grating 43 via a first reflective element 71 and a second reflective element 72. The third diffraction grating 43 forms a diffraction pattern comprising a fifth branch radiation beam $B_e$, a sixth branch radiation beam $B_f$ and a third sub-beam 63. The third sub-beam 63 is incident on a fourth diffraction grating 44. The fourth diffraction grating 44 forms a diffraction pattern comprising a seventh branch radiation beam $B_g$, an eighth branch radiation beam $B_h$ and a fourth sub-beam 64. The fourth sub-beam 64 is incident on a third reflective element 73 followed by a fourth reflective element 74.

The first, second, third and fourth reflective elements 71-74 are configured to reverse a retardance which is introduced into the sub-beams 61-64 at the diffraction gratings 41-44. For example, the first diffraction grating 41 may introduce a retardance in the first sub-beam 61 such that the sub-beam 61 which is incident on a second diffraction grating has a different polarization state to the input radiation beam B which is incident on the first diffraction grating 41. The second diffraction grating 42 may introduce a further retardance into the second sub-beam 62. The first and second reflective elements 71, 72 are arranged such that the planes of incidence at the first and second reflective elements 71, 72 are substantially perpendicular to the planes of incidence at the first and second diffraction gratings 41, 42. Consequently the orthogonal polarization components between which a phase difference is introduced are the same at the first and second diffraction gratings 41, 42 and at the first and second reflective elements 71, 72. The direction of the phase difference which is introduced at the first and second reflective elements 71, 72 opposes the direction of the phase difference which is introduced at the first and second diffraction gratings 41, 42.

The first and second reflective elements 71, 72 may be configured such that the net retardance caused at the first and second reflective elements 71, 72 is substantially equal and opposite to the net retardance caused at the first and second diffraction gratings 41, 42. This may, for example, be achieved if the sum of the grazing incidence angles at the first and second reflective elements 71, 72 is substantially equal to the sum of the grazing incidence angles at the first and second diffraction gratings 41, 42. The polarization state of the second sub-beam 62 which is incident on the third diffraction grating is therefore substantially the same as the polarization state of the input radiation beam B which is incident on the first diffraction grating 41.

Whilst not shown in FIGS. 12A and 12B, each of the branch radiation beam $B_a$-$B_h$ may be directed to lithographic apparatuses by respective directing optics. As was described above with reference to FIGS. 9 and 10, each of the directing optics may be configured so as to introduce the same retardance into each of the branch radiation beams. In order for all of the lithographic apparatuses to be provided with branch radiation beams having substantially the same polarization state it is therefore desirable for the polarization states of the radiation beams incident on each of the diffraction gratings 41-44 to be substantially the same.

As was explained above, the first and second reflective elements 71, 72 are configured such that the polarization state of the second sub-beam 62, which is incident on the third diffraction grating 43 is substantially the same as the polarization state of the input radiation beam, which is incident on the first diffraction grating 41. Advantageously, the polarization states of the fifth and sixth branch radiation beams $B_e$, $B_f$ formed at the third diffraction grating 43 may therefore be substantially the same as the polarization states of the first and second branch radiation beams $B_a$, $B_b$ formed at the first diffraction grating 41.

In some embodiments, the beam delivery system BDS may include one or more further reflective elements in the optical path of the first sub-beam 61 between the first diffraction grating 41 and the second diffraction grating 42. The one or more further reflective elements may be configured to introduce a retardance in the first sub-beam 61 which is substantially equal and opposite to the retardance caused by the first diffraction grating 41. The first sub-beam 61 which is incident on the second diffraction grating 42 may therefore have substantially the same polarization state as the input radiation beam B which is incident on the first diffraction grating 41.

In the embodiment which is shown in FIGS. 12A and 12B no further reflective elements are provided in between the first diffraction grating 41 and the second diffraction grating 42. Consequently the polarization state of the first sub-beam 61 which is incident on the second diffraction grating 42 may be slightly different to the polarization state of the input radiation beam B which is incident on the first diffraction grating 41 (due to the retardance introduced at the first diffraction grating). The polarization states of the third and fourth branch radiation beams $B_c$, $B_d$ formed at the second diffraction grating 42 may therefore be slightly different to the polarization states of the first and second branch radiation beams $B_a$, $B_b$ formed at the first diffraction grating 41. Typically the retardance introduced into a $0^{th}$ diffraction order at a diffraction grating is approximately proportional to the grazing incidence angle at the diffraction grating (for small grazing incidence angles). The grazing incidence angle at the first diffraction grating 41 may be less than 5°, for example, around 2° or even less, for example around 1°. The retardance introduced at the first diffraction grating 41 may therefore be relatively small. The difference between the polarization states of the first sub-beam 61 and the input radiation beam B may therefore be relatively small and may be acceptable. Accordingly no reflective elements are provided between the first diffraction grating 41 and the second diffraction grating 42.

Reflective elements 71, 72 are provided in between the second diffraction grating 42 and the third diffraction grating 43 so as to reverse the net retardance caused at the first and second diffraction gratings 41, 42. Whilst the retardance introduced at a single diffraction grating may be acceptable, the net retardance introduced at two diffraction gratings may be large enough to require adjustment (e.g. by the first and second reflective elements 71, 72).

In the embodiment which is depicted in FIGS. 12A and 12B, third and fourth reflective elements 73, 74 are provided in the optical path of the fourth sub-beam 64. The third and fourth reflective elements 73, 74 may be configured to introduce a retardance in the fourth sub-beam 64 which is substantially equal and opposite to the net retardance introduced by the third and fourth diffraction gratings 43, 44. The polarization state of the fourth sub-beam 64 which is reflected from the fourth reflective element may therefore be substantially the same as the polarization state of the second sub-beam 62 which is incident on the third diffraction grating 43 and the input radiation beam B which is incident on the first diffraction grating 41. The fourth sub-beam 64 which is reflected from the fourth reflective element may, for example, be provided to a further diffraction grating which is not shown in FIGS. 12A and 12B. The further diffraction grating may be configured to split the fourth sub-beam 64 to form further branch radiation beams.

In general one or more reflective elements may be included at any point in the optical path of radiation through a beam delivery system BDS. The one or more reflective elements may be configured to introduce a retardance in a radiation beam which is substantially equal and opposite to a retardance introduced at one or more diffraction gratings.

Figure 13:
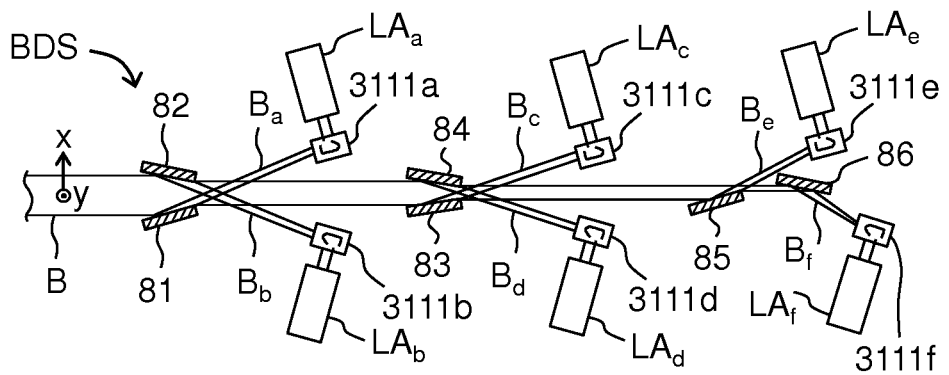
FIG. 13 is a schematic illustration of a beam delivery system according to an alternative embodiment of the invention.

Embodiments of directing optics have been described above in which the directing optics are configured to receive branch radiation beams formed at a beam-splitting apparatus comprising one or more diffraction gratings. The directing optics may additionally or alternatively be used in conjunction with other forms of beam-splitting apparatus. FIG. 13 is a schematic illustration of a beam delivery system BDS comprising an alternative embodiment of a beam-splitting apparatus. The beam-splitting apparatus comprises a plurality of reflective elements 81-86. The reflective elements 81-86 are arranged to receive respective portions of an input radiation beam and reflect the portions so as to form branch radiation beams $B_a$-$B_f$.

A first reflective element 81 is arranged to receive a first portion of the input radiation beam B and reflect the first portion so as to form a first branch radiation beam $B_a$. A second reflective element 82 is arranged to receive a second portion of the input radiation beam B and reflect the second portion so as to form a second branch radiation beam $B_b$. The first branch radiation beam $B_a$ is directed to a first lithographic apparatus $LA_a$ by first directing optics 3111*a*. The second branch radiation beam $B_b$ is directed to a second lithographic apparatus $LA_b$ by second directing optics 3111*b*. The first and second directing optics 3111*a*, 3111*b* may be similar to the first and second directing optics 31*a*, 31*b* which were described above with reference to FIG. 9. In particular the first and second directing optics may comprise reflective elements which are arranged such that a retardance introduced in the first branch radiation beam $B_a$ is substantially the same as a retardance introduced in the second branch radiation beam $B_b$. The polarization state of the first branch radiation beam $B_a$ which is provided to the first lithographic apparatus $LA_a$ may therefore be substantially the same as the polarization state of the second branch radiation beam B which is provided to the second lithographic apparatus $LA_b$.

Portions of the input radiation beam B which are not incident on the first or second reflective elements 81, 82 are received by one of third 83, fourth 84, fifth 85 or sixth 86 reflective elements. Each of the third 83, fourth 84, fifth 85 and sixth 86 reflective elements are arranged to receive a portion of the input radiation beam and reflect the respective portion so as to form a branch radiation beam $B_c$-$B_f$. Each of the branch radiation beams $B_c$-$B_f$ are directed to a lithographic apparatus $LA_c$-$LA_f$ by respective directing optics 3111*c*-3111*f*. Each of the directing optics 3111*c*-3111*f* may be arranged to introduce substantially the same retardance to each of the branch radiation beams $B_c$-$B_f$. The polarization states of each of the branch radiation beams $B_c$-$B_f$ which are provided to the lithographic apparatuses $LA_c$-$LA_f$ may therefore be substantially the same as each other.

Embodiments of a beam-splitting apparatus have been described above with reference to FIGS. 9-13, in which one or more optical elements are arranged to receive an input radiation beam and split the input radiation beam into at least a first output radiation beam and a second output radiation beam, which propagate in different directions. For example, a diffraction grating may be provided with forms a +1 and a −1 diffraction order, which form first and second branch radiation beams respectively, where the first and second branch radiation beams propagate in different directions. Consequently, first directing optics which receive the first branch radiation beam may be orientated different to second directing optics which receive the second branch radiation beam. As was described above the first and second directing optics may be arranged such that a polarization change which is induced by the first directing optics is substantially the same as a polarization change which is induced by the second directing optics.

In other embodiments, a beam-splitting apparatus may be arranged so as to form branch radiation beams which all propagate in substantially the same direction. For example, in the embodiment of a beam splitting-apparatus which is shown in FIG. 6 each of the branch radiation beams $B_a$-$B_d$ are formed from a +1 diffraction order formed at a diffraction grating. The diffraction gratings may be arranged such that each of the branch radiation beams $B_a$-$B_d$ propagate in substantially the same direction. This may allow each of the directing optics 31a-31d to be substantially the same as each other. If the directing optics 31a-31d are all substantially the same as each other then a polarization change, which is caused by the directing optics 31a-31d will be substantially the same for each branch radiation beam $B_a$-$B_d$ regardless of the arrangement of the directing optics 31a-31d. This may allow greater freedom in the design of the directing optics 31a-31d whilst still providing the lithographic apparatuses $LA_a$-$LA_d$ with branch radiation beams 31a-31d each having substantially the same polarization state. A beam-splitting apparatus of the type shown in FIG. 6 may therefore advantageously simplify the design of the directing optics 31a-31d.

It will be appreciated that in an arrangement of the type shown in FIG. 6, a larger number of diffraction gratings are required in order to provide a given number of branch radiation beams. For example, in the embodiment which is shown in FIGS. 4A and 4B, five diffraction gratings provide ten branch radiation beams. In order to provide ten branch radiation beams using an arrangement of the type shown in FIG. 6, nine diffraction gratings may be required. Consequently, one or more of the branch radiation beams may have undergone nine reflections at a diffraction grating, whereas in the embodiment of FIGS. 4A and 4B, the maximum number of reflections at a diffraction grating which a branch radiation beam undergoes is five. Since some radiation will be lost during each reflection at a diffraction grating, an arrangement of the type shown in FIG. 6 may lead to more radiation loss by absorption at a diffraction grating than is the case in an arrangement of the type shown in FIGS. 4A and 4B.

However, the greater freedom in the design of the directing optics, which is afforded by the arrangement of FIG. 6 may allow the increased absorption at the diffraction gratings to be counter-acted by less absorption at the directing optics. For example, the directing optics used in an arrangement of the type shown in FIG. 6 may be arranged to reduce absorption loss at the directing optics. The arrangement of the directing optics used in conjunction with an embodiment of the type shown in FIGS. 4A and 4B may be arranged specifically to bring about a desired polarization change. Such an arrangement may lead to an increased amount of absorption at the directing optics. It is therefore possible to provide an embodiment of the type shown in FIG. 6 which leads to less total absorption loss than an embodiment of the type shown in FIGS. 4A and 4B.

Embodiments of reflective diffraction gratings have been described above in which a diffraction grating comprises a substrate on which a reflective coating is disposed. For example, a diffraction grating may comprise a silicon substrate on which a ruthenium reflective coating is disposed. The structure of the diffraction grating may be formed by selectively etching portions of the substrate. For example a mask may first be formed on a substrate and regions of the substrate which are not covered by the mask may be subjected to an etching process.

The mask may be formed using a photo-lithographic process. For example a photoresist may initially be deposited onto all regions of the substrate. Portions of the photoresist may then be exposed to radiation as part of a lithographic exposure, thereby triggering a change of state of the exposed portions. The resist may then be developed either by removing the exposed portions of the resist or removing the non-exposed portions of the resist (depending on whether a positive or negative resist is used). The remaining portions of the resist may form an etch resistant mask (e.g. comprising a plurality of parallel ridges). A lithographic exposure may, for example, be performed by stepping or scanning a patterning device relative to the substrate. The patterning device may impart a radiation beam with a pattern which may be scanned or stepped across the substrate.

An etch process may then be performed which, due to the presence of the etch resistant mask, only etches regions of the substrate which are not covered by the etch resistant mask. The etch process may form grooves in the substrate whilst leaving ridges which extend between the grooves. The etch resistant mask may subsequently be removed from the substrate so as to expose substantially flat ridges. A reflective coating (e.g. a ruthenium or molybdenum coating) may then be deposited onto the substrate to form a reflective diffraction grating.

Figure 14:
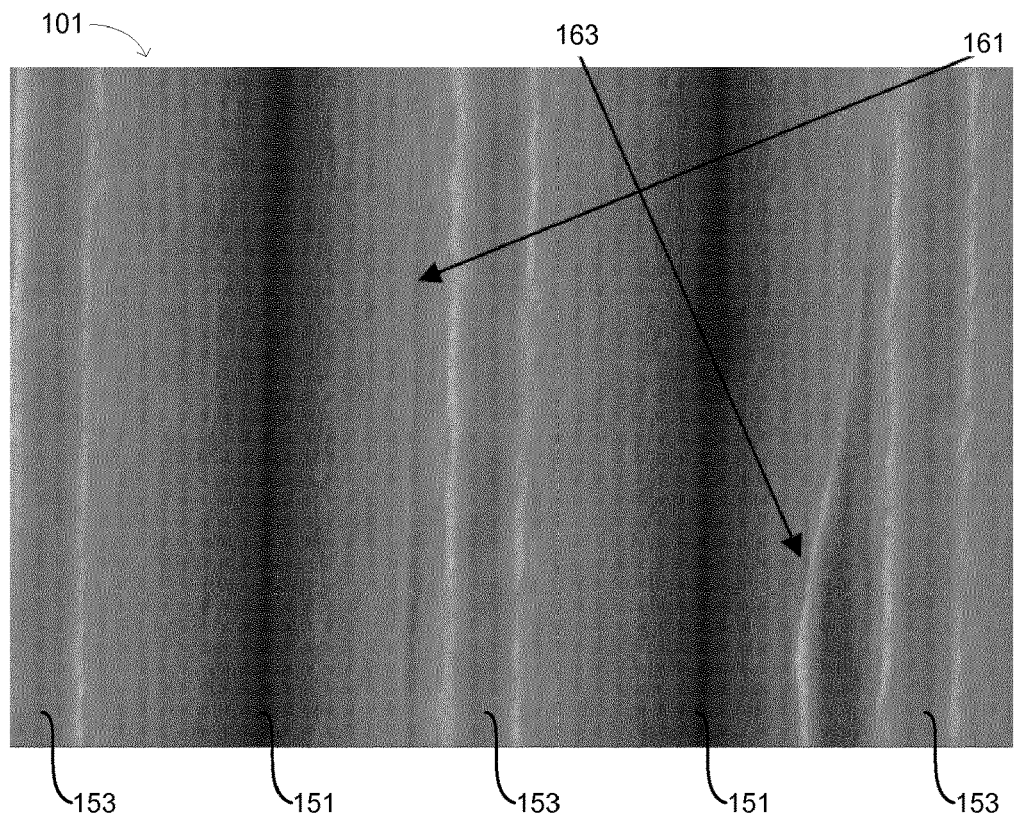
FIG. 14 is an image of a portion of a diffraction grating including a defect.

Using the method described above to form a diffraction grating may, in some circumstances, lead to defects being present in the reflective coating. For example, it is possible that a reflective coating may include one or more defects and/or may become delaminated from the substrate. FIG. 14 is an image taken with a scanning electron microscope of a portion of a reflective diffraction grating 101. The diffraction grating 101 includes grooves 151 disposed in between ridges 153. The structure of the diffraction grating is coated with a reflective coating (e.g. a ruthenium coating). It can be seen from FIG. 14 that the reflective coating includes a defect 161 running along the left-hand side of the central ridge 153 shown in FIG. 14. It can be further seen from FIG. 14 that the diffraction grating includes a region 163 in which the reflective coating has become delaminated from the substrate.

Defects in a reflective coating may affect the optical properties of the diffraction grating 101 and may in particular be detrimental to the optical properties of the diffraction grating. It is therefore desirable to provide a diffraction grating which does not include defects of the type shown in FIG. 14.

Figure 15:
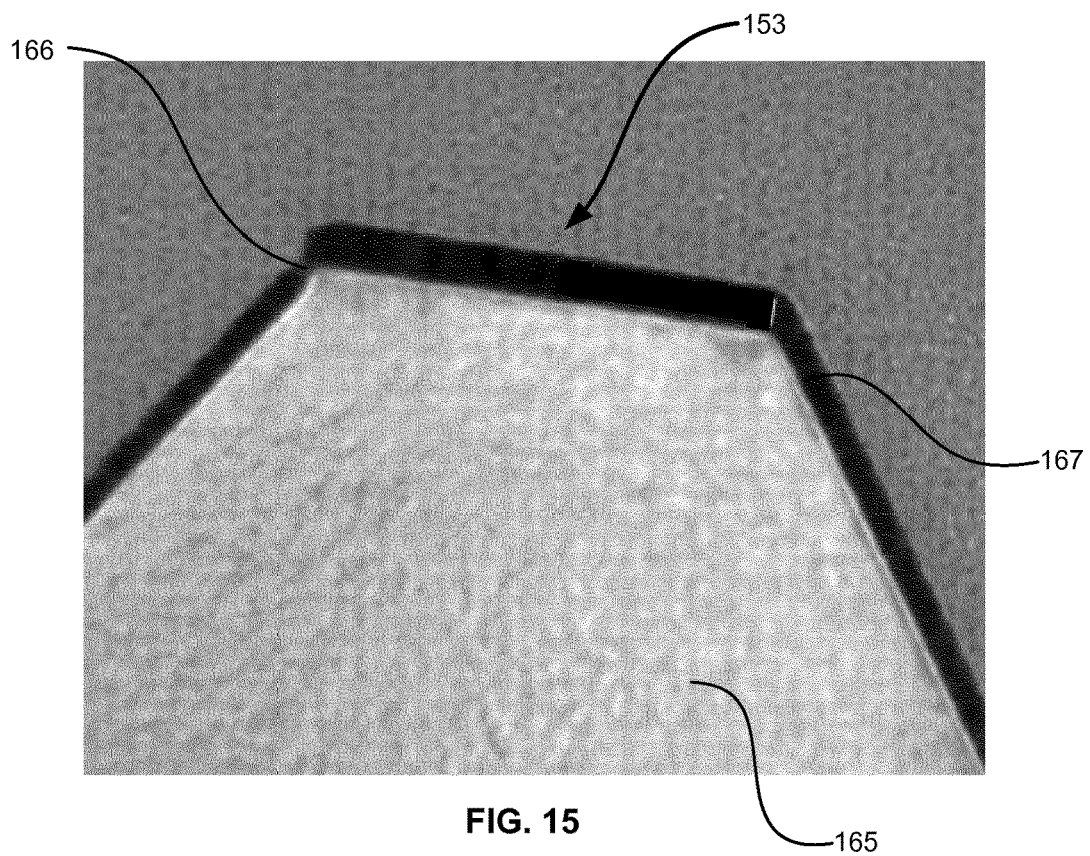
FIG. 15 is an image showing a side view of a portion of a diffraction grating including a defect.

Both of the defects 161, 163 which are seen in FIG. 14 are in the proximity of an edge of a ridge 153. These regions may, in particular, be susceptible to the formation of defects. FIG. 15 is an image showing a cross-sectional view of a portion of a ridge 153 which forms part of a diffraction grating. The ridge 153 is formed from a structured substrate 165. A reflective coating 167 is disposed on the substrate 165. It can be seen from FIG. 15 that the reflective coating 167 includes a thinned portion 166 where the thickness of the reflective coating 167 is reduced relative to the remainder of the reflective coating 167. The thinned portion 166 is located in proximity to a corner of the ridge 153. At this corner it can be seen that the substrate 165 is not shaped to form a sharp edge but instead includes a defect. Such a defect may result in the reflective coating 167 including a thinned portion 166 as is shown in FIG. 15. The thinned portion 166 of the reflective coating may be structurally weaker than the rest of the reflective portion and may lead to a defect in the reflective coating 167. For example, delamination of the reflective coating 167 may occur at the thinned portion 166.

Defects in the substrate 165, such as the defect seen in the location of the thinned portion 166 in FIG. 15, may result from under-etching of the grooves 151. Consequently one or more edges of a ridge 153 may include defects, as is seen in the vicinity of the thinned portion 166 in FIG. 15. It is desirable to etch the substrate such that edges are formed in the substrate (e.g. edges of a ridge 153) which facilitate adhesion of a reflective coating to the substrate 165. For example, it is desirable to etch the substrate such that the substrate includes substantially no defects which might lead to delamination of the reflective coating 167 from the substrate 165.

In some embodiments, the effect of under-etching of the substrate may be reduced by applying a further etching process to the substrate. For example, a mask which is used to selectively etch the grooves 151 may be removed and a non-selective etching process may be carried out with no mask in place. The non-selective etching process may, for example, be carried out for a relatively short period of time. A relatively short non-selective etching process may have the effect of rounding edges on the substrate. For example, edges of the ridges 165 may be substantially rounded by a relatively short non-selective etching process. Rounding of edges on the substrate may advantageously smooth out any defects in the substrate (e.g. defects caused by under-etching of the substrate). Consequently, adhesion of the reflective coating 167 to the substrate 165 may be improved and the presence of defects in the reflective coating 167 may be advantageously reduced.

Figure 16:
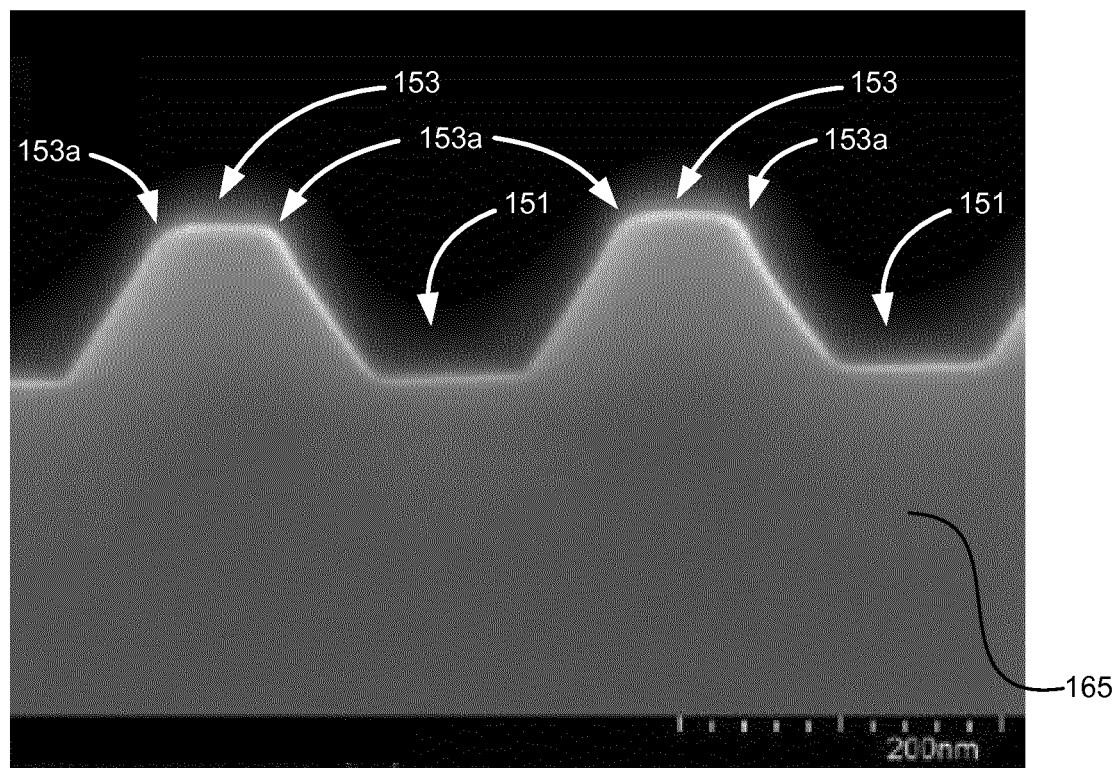
FIG. 16 is an image showing of a portion of a diffraction grating after having been subjected to a non-selective etching process.

FIG. 16 is an image of a portion of a substrate 165 which may form part of a diffraction grating. The substrate 165 includes ridges 153 interspersed with flat bottomed grooves 151. The ridges and grooves may be formed in the substrate 165 using a selective etching process (e.g. using a mask) as was described above. The substrate 165 is subsequently subjected to a non-selective etching process for a relatively short period of time. As was described above, the non-selective etching process has the effect of rounding-off corners on the substrate. This can be seen in FIG. 16 in which corners 153a of the ridges 153 appear rounded. Advantageously this improves adhesion between the substrate 165 and a reflective coating which is subsequently disposed on the substrate 165. Consequently defects in the reflective coating are reduced or eliminated.

As was described above, a non-selective etching process changes the shape of the diffraction grating structure formed by the substrate 165 (for example, by rounding corners on the substrate). The change in shape of the diffraction grating structure may affect the optical properties of the diffraction grating. For example, the split ratio of the diffraction grating may be affected by rounding corners of the diffraction grating structure. Changes in the optical properties of the diffraction grating which result from a non-selective etching process may be compensated for by altering one or more other properties of the diffraction grating. For example, the width of flat-bottomed portions of the grooves 151 and/or the width of flat-topped portions of the ridges 153 may be altered so as to compensate for any optical effects resulting from rounding corners of the diffraction grating structure. Additionally or alternatively, the pitch of the diffraction grating may be altered so as to compensate for any optical effects resulting from rounding corners of the diffraction grating structure. A diffraction grating having desired optical properties (e.g. a desired split ratio) and a reduced chance of defects in a reflective coating, may therefore be designed and manufactured by subjecting a substrate to a non-selective etching process and accounting for the effect of the non-selective etching process when setting other parameters of the diffraction grating.

The process of including a non-selective etching process in the manufacture of a diffraction gratin was described above in the context of diffraction gratings including flat-bottomed grooves and flat-topped ridges. However, it will be appreciated that the advantages provided by the non-selective etching process may also apply to other forms of diffraction grating structure. For example, a diffraction grating structure which includes grooves having substantially no flat-bottomed portion may also benefit from being subjected to a non-selective etching process, in order to improve adhesion between a substrate and reflective coating which form the diffraction grating.

Whilst embodiments of a radiation source SO have been described and depicted as comprising a free electron laser FEL, a radiation source SO may include a source of radiation other than a free electron laser FEL.

It should be appreciated that a radiation source which comprises a free electron laser FEL may comprise any number of free electron lasers FEL. For example, a radiation source may comprise more than one free electron laser FEL. For example, two free electron lasers may be arranged to provide EUV radiation to a plurality of lithographic apparatus. This is to allow for some redundancy. This may allow one free electron laser to be used when the other free electron laser is being repaired or undergoing maintenance.

A lithographic system LS may comprise any number of lithographic apparatuses. The number of lithographic apparatuses which form a lithographic system LS may, for example, depend on the amount of radiation which is output from a radiation source SO and on the amount of radiation which is lost in a beam delivery system BDS. The number of lithographic apparatuses which form a lithographic system LS may additionally or alternatively depend on the layout of a lithographic system LS and/or the layout of a plurality of lithographic systems LS.

Embodiments of a lithographic system LS may also include one or more mask inspection apparatuses MIA and/or one or more Aerial Inspection Measurement Systems (AIMS). In some embodiments, the lithographic system LS may comprise a plurality of mask inspection apparatuses to allow for some redundancy. This may allow one mask inspection apparatus to be used when another mask inspection apparatus is being repaired or undergoing maintenance. Thus, one mask inspection apparatus is always available for use. A mask inspection apparatus may use a lower power radiation beam than a lithographic apparatus.

Further, it will be appreciated that radiation generated using a free electron laser FEL of the type described herein may be used for applications other than lithography or lithography related applications.

It will be further appreciated that a free electron laser comprising an undulator as described above may be used as a radiation source for a number of uses, including, but not limited to, lithography.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

The lithographic apparatus which have been described herein may be used in the manufacture of ICs. Alternatively, the lithographic apparatuses described herein may have other applications. Possible other applications include the manufacture of integrated optical systems, guidance and detection patterns for magnetic domain memories, flat-panel displays, liquid-crystal displays (LCDs), thin-film magnetic heads, etc.

Different embodiments may be combined with each other. Features of embodiments may be combined with features of other embodiments.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A beam-splitting apparatus comprising:
a first conical diffraction grating configured to split a first beam of radiation to generate at least a second beam of radiation consisting essentially of a zeroth diffraction order and a third beam of radiation consisting essentially of a non-zero diffraction order; and
a second conical diffraction grating configured to split the second beam to generate at least a fourth beam of radiation consisting essentially of a diffraction order and a fifth beam of radiation consisting essentially of a non-zero diffraction order different from the diffraction order of the fourth beam, wherein the beam-splitting apparatus is configured to generate output radiation beams comprising the third and fifth beams.

2. The beam-splitting apparatus of claim 1, wherein the output radiation beams are coupled to a plurality of lithographic apparatuses.

3. The beam-splitting apparatus of claim 1, wherein the first and second conical diffraction gratings are further configured such that the output radiation beams have approximately equal power.

4. The beam-splitting apparatus of claim 1, wherein the first and second conical diffraction gratings are further configured such that the third and fifth beams have approximately equal power.

5. The beam-splitting apparatus of claim 1, wherein the first conical diffraction grating is further configured such that a power of the is greater than a power of the third beam.

6. The beam-splitting apparatus of claim 1, wherein the first conical diffraction grating is further configured such that a power of the second beam is 50% or more of a power of the first beam.

7. The beam-splitting apparatus of claim 1, wherein the second conical diffraction grating is further configured such that a power of the fourth beam is greater than a power of the fifth beam.

8. The beam-splitting apparatus of claim 1, wherein the second conical diffraction grating is further configured such that a power of the fourth beam is 50% or more of a power of the second beam from the first conical diffraction grating.

9. The beam-splitting apparatus of claim 1, wherein:
the first conical diffraction grating is further configured to generate a further beam of radiation consisting essentially of a non-zero diffraction order different from the non-zero diffraction order of the third beam; and
the output radiation beams further comprise the further beam.

10. The beam-splitting apparatus of claim 9, wherein the first conical diffraction grating is further configured such that the third beam and the further beam have approximately equal power.

11. The beam-splitting apparatus of claim 1, wherein:
the second conical diffraction grating is further configured to generate a further beam of radiation consisting essentially of a non-zero diffraction order different from the non-zero diffraction order of the fifth beam; and
the output radiation beams further comprise the further beam.

12. The beam-splitting apparatus of claim 11, wherein the second conical diffraction grating is further configured such that the fifth beam and the further beam have approximately equal power.

13. The beam-splitting apparatus of claim 1, further comprising a third conical diffraction grating configured to split the fourth beam to generate at least a sixth beam of radiation consisting essentially of a zeroth diffraction order and a seventh beam of radiation consisting essentially of a non-zero diffraction order, wherein the output radiation beams further comprise the seventh beam.

14. The beam-splitting apparatus of claim 13, wherein the first, second, and third conical diffraction gratings are further configured such that the output radiation beams have approximately equal power.

15. The beam-splitting apparatus of claim 1, wherein:
at least one of the first and second conical diffraction gratings comprises a reflective surface comprising periodic grooves and ridges disposed on the reflective surface; and
each of the periodic grooves has a substantially flat bottom portion extending between inclined portions.

16. The beam-splitting apparatus of claim 15, wherein the at least one of the first and second conical diffraction gratings comprises a substrate and the reflective surface comprises a reflective coating disposed on the substrate.

17. The beam-splitting apparatus of claim 16, wherein the substrate comprises a silicon substrate.

18. The beam-splitting apparatus of claim 16, wherein the reflective coating comprises at least one of ruthenium and molybdenum.

19. The beam-splitting apparatus of claim 15, wherein a width of the flat bottom portion of the each of the periodic grooves of the first conical diffraction grating is different to a width of the flat bottom portion of the each of the periodic groves of the second conical diffraction grating.

20. The beam-splitting apparatus of claim 19, wherein the width of the flat bottom portion of the each of the periodic groves of the first conical diffraction grating is greater than the width of the flat bottom portion of the each of the periodic groves of the second conical diffraction grating.

21. The beam-splitting apparatus of claim 1, wherein a pitch of the first conical diffraction grating is approximately equal to a pitch of the second conical diffraction grating.

22. The beam-splitting apparatus of claim 1, further comprising one or more actuators configured to adjust an orientation of at least one of the first and second conical diffraction gratings to adjust a grazing angle and/or an azimuthal angle with which radiation is incident on the at least one of the first and second conical diffraction gratings.

23. The beam-splitting apparatus of claim 1, further comprising a third conical diffraction grating configured to split the fourth beam to generate at least a sixth beam of radiation consisting essentially of a non-zero diffraction order, wherein the output radiation beams further comprise the sixth beam.

24. The beam-splitting apparatus of claim 23, wherein:
the third conical diffraction grating is further configured to generate a further beam of radiation consisting essentially of a non-zero diffraction order different from the non-zero diffraction order of the sixth beam; and
the output radiation beams further comprise the further beam.

25. The beam-splitting apparatus of claim 24, wherein the third reflective grating is further configured such that the sixth beam and the further beam are of approximately equal power.

26. The beam-splitting apparatus of claim 1, further comprising additional conical diffraction gratings configured to split the fourth beam to generate further beams of radiation consisting essentially of non-zero diffraction orders, wherein the output radiation beams further comprise the further beams.

27. The beam-splitting apparatus of claim 26, wherein the first, second, and additional conical diffraction gratings are further configured such that the output radiation beams have approximately equal power.

28. The beam-splitting apparatus of claim 1, wherein the first conical diffraction grating is oriented to diffract the beam such that the first and second beams are in a plane of incidence and the second and third beams are in a plane different from the plane of incidence.

29. The beam-splitting apparatus of claim 1, wherein the first conical diffraction grating comprises grooves oriented in a first direction that is substantially parallel to a plane of incidence.

30. The beam-splitting apparatus of claim 1, wherein the first conical diffraction grating comprises grooves oriented in a first direction that is neither perpendicular or parallel to a plane of incidence.

31. The beam-splitting apparatus of claim 1, wherein the first beam impinges the first conical diffraction grating at an incident grazing angle less than approximately 5 degrees.

32. The beam-splitting apparatus of claim 1, wherein:
the first and second conical diffraction gratings are part of an arrangement of a plurality of conical diffraction gratings; and
every beam of radiation that is passed from a conical diffraction grating to another conical diffraction grating consists essentially of a zeroth diffraction order, whereby a sensitivity of the output beams with respect to wavelength variations of the first beam is reduced.

33. A beam delivery system comprising:
a beam-splitting apparatus comprising:
a first conical diffraction grating configured to split a first beam of radiation to generate at least a second beam of radiation consisting essentially of a zeroth diffraction order and a third beam of radiation consisting essentially of a non-zero diffraction order; and
a second conical diffraction grating configured to split the second beam to generate at least a fourth beam of radiation consisting essentially of a zeroth diffraction order and a fifth beam of radiation consisting essentially of a non-zero diffraction order,
wherein the beam splitting apparatus is configured to generate output radiation beams comprising the third and fifth beams; and
directing optics configured to direct the output radiation beams to lithographic apparatuses.

34. The beam delivery system of claim 33, wherein the first and second conical diffraction gratings are further configured such that the output radiation beams have approximately equal power.

35. The beam delivery system of claim 33, wherein:
the first conical diffraction grating is further configured to generate a further beam of radiation consisting essentially of a non-zero diffraction order different from the non-zero diffraction order of the third beam; and
the output radiation beams further comprise the further beam.

36. The beam delivery system of claim 33, wherein:
the second conical diffraction grating is further configured to generate a further beam of radiation consisting essentially of a non-zero diffraction order different from the non-zero diffraction order of the fifth beam; and
the output radiation beams further comprise the further beam.

37. The beam delivery system of claim 33, wherein:
the beam-splitting apparatus further comprises a third conical diffraction grating configured to split the fourth beam to generate at least a sixth beam of radiation consisting essentially of a zeroth diffraction order and a seventh beam of radiation consisting essentially of a non-zero diffraction order; and
the output radiation beams further comprise the seventh beam.

38. The beam delivery system of claim 33, wherein:
the beam-splitting apparatus further comprises a third conical diffraction grating configured to split the fourth beam to generate at least a sixth beam of radiation consisting essentially of a non-zero diffraction order and a seventh beam consisting essentially of a non-zero diffraction order different from the non-zero diffraction order of the sixth beam; and
the output radiation beams further comprise the sixth and seven beams.

39. The beam delivery system of claim 38, wherein the first, second, and third conical diffraction gratings are further configured such that the output radiation beams have approximately equal power.

40. The beam delivery system of claim 33, wherein:
the beam-splitting apparatus further comprises additional conical diffraction gratings configured to split the fourth beam to generate further beams of radiation consisting essentially of non-zero diffraction orders; and
the output radiation beams further comprise the further beams.

41. A lithographic system comprising:
a beam delivery system comprising:
a beam-splitting apparatus comprising:
a first conical diffraction grating configured to split a first beam of radiation to generate at least a second beam of radiation consisting essentially of a zeroth diffraction order and a third beam of radiation consisting essentially of a non-zero diffraction order; and
a second conical diffraction grating configured to split the second beam to generate at least a fourth beam of radiation consisting essentially of a zeroth diffraction order and a fifth beam of radiation consisting essentially of a non-zero diffraction order,
wherein the beam splitting apparatus is configured to generate output radiation beams comprising the third and fifth beams; and
directing optics configured to direct the output radiation beams to lithographic apparatuses; and
first and second lithographic apparatuses configured to receive the third and fifth beams, respectively.

42. The lithographic system of claim 41, further comprising a radiation source configured to generate the first beam.

43. The lithographic system of claim 42, wherein the radiation source comprises a free electron laser.

44. The lithographic system of claim 41, wherein:
the first conical diffraction grating is further configured to generate a further beam of radiation consisting essentially of a non-zero diffraction order different from the non-zero diffraction order of the third beam; and
the output radiation beams further comprise the further beam.

45. The lithographic system of claim 41, wherein:
the second conical diffraction grating is further configured to generate a further beam of radiation consisting essentially of a non-zero diffraction order different from the non-zero diffraction order of the fifth beam; and
the output radiation beams further comprise the further beam.

46. The lithographic system of claim 41, wherein:
the beam-splitting apparatus further comprises a third conical diffraction grating configured to split the fourth beam to generate at least a sixth beam of radiation consisting essentially of a zeroth diffraction order and a seventh beam of radiation consisting essentially of a non-zero diffraction order; and
the output radiation beams further comprise the seventh beam.

47. The lithographic system of claim 41, wherein:
the beam-splitting apparatus further comprises a third conical diffraction grating configured to split the fourth beam to generate at least a sixth beam of radiation consisting essentially of a non-zero diffraction order and a seventh beam consisting essentially of a non-zero diffraction order different from the non-zero diffraction order of the sixth beam; and
the output radiation beams further comprise the sixth and seven beams.

48. The lithographic system of claim 41, wherein:
the beam-splitting apparatus further comprises additional conical diffraction gratings configured to split the fourth beam to generate further beams of radiation consisting essentially of non-zero diffraction orders; and
the output radiation beams further comprise the further beams.

* * * * *

UNITED STATES PATENT AND TRADEMARK OFFICE
CERTIFICATE OF CORRECTION

PATENT NO.         : 11,112,618 B2                                    Page 1 of 1
APPLICATION NO.    : 15/754480
DATED              : September 7, 2021
INVENTOR(S)        : De Vries et al.

It is certified that error appears in the above-identified patent and that said Letters Patent is hereby corrected as shown below:

In the Claims

In Column 46, Line 43, Claim 38, please replace "seven" with --seventh--.

In Column 48, Line 20, Claim 47, please replace "seven" with --seventh--.

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*